(12) United States Patent
Tani et al.

(10) Patent No.: US 9,780,760 B2
(45) Date of Patent: Oct. 3, 2017

(54) VARIABLE FILTER CIRCUIT AND WIRELESS COMMUNICATION APPARATUS

(71) Applicant: Murata Manufacturing Co., Ltd., Kyoto (JP)

(72) Inventors: Masakazu Tani, Kyoto (JP); Shouzo Sugiyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/230,666

(22) Filed: Aug. 8, 2016

(65) Prior Publication Data

US 2016/0344370 A1    Nov. 24, 2016

Related U.S. Application Data

(63) Continuation of application No. PCT/JP2015/053171, filed on Feb. 5, 2015.

(30) Foreign Application Priority Data

Feb. 10, 2014  (JP) .................................. 2014-023341
Sep. 30, 2014  (JP) .................................. 2014-202078

(51) Int. Cl.
| | |
|---|---|
| *H04B 1/10* | (2006.01) |
| *H03H 9/64* | (2006.01) |
| *H03H 7/01* | (2006.01) |
| *H03H 7/075* | (2006.01) |
| *H03H 9/54* | (2006.01) |
| *H04B 1/00* | (2006.01) |

(52) U.S. Cl.
CPC ............ *H03H 9/64* (2013.01); *H03H 7/0161* (2013.01); *H03H 7/075* (2013.01); *H03H 9/542* (2013.01); *H04B 1/0064* (2013.01)

(58) Field of Classification Search
CPC .... H03H 9/6403; H03H 7/0115; H03H 7/075; H03H 9/542
USPC ............... 455/176.1, 213, 307; 333/202, 219
See application file for complete search history.

(56) References Cited

U.S. PATENT DOCUMENTS

| | | |
|---|---|---|
| 6,472,953 B1 | 10/2002 | Sakuragawa et al. |
| 6,525,624 B1 | 2/2003 | Hikita et al. |
| 2001/0048352 A1 | 12/2001 | Klee et al. |
| 2004/0058664 A1 | 3/2004 | Yamamoto |

(Continued)

FOREIGN PATENT DOCUMENTS

| | | |
|---|---|---|
| JP | H10-65490 A | 3/1998 |
| JP | H11-41055 A | 2/1999 |

(Continued)

OTHER PUBLICATIONS

Written Opinion of WO2015/119178A1 dated Apr. 28, 2015.

(Continued)

*Primary Examiner* — Sonny Trinh
(74) *Attorney, Agent, or Firm* — Pearne & Gordon LLP

(57) ABSTRACT

A variable filter circuit includes a serial arm connected between ports (P1-P2), a parallel arm having a resonator connected in series between ports (P1-P3), and another parallel arm having another resonator connected in series between ports (P2-P3). The serial arm includes an inductor connected between the ports (P1-P2), and the parallel arms include variable capacitances connected in series to the resonators.

17 Claims, 15 Drawing Sheets

(56) References Cited

U.S. PATENT DOCUMENTS

| | | |
|---|---|---|
| 2004/0119561 A1 | 6/2004 | Omote |
| 2005/0099244 A1 | 5/2005 | Nakamura et al. |
| 2005/0212612 A1 | 9/2005 | Kawakubo et al. |
| 2009/0201104 A1 | 8/2009 | Ueda |
| 2011/0199169 A1 | 8/2011 | Kadota |
| 2014/0106698 A1* | 4/2014 | Mi ................... H03H 7/0123 455/307 |
| 2016/0344364 A1* | 11/2016 | Ogami ................ H01G 7/06 |
| 2016/0344370 A1* | 11/2016 | Tani ................... H03H 7/0161 |
| 2016/0352310 A1* | 12/2016 | Tani ................... H03H 9/64 |

FOREIGN PATENT DOCUMENTS

| | | |
|---|---|---|
| JP | 2000-323961 A | 11/2000 |
| JP | 2001-069031 A | 3/2001 |
| JP | 2002-290204 A | 10/2002 |
| JP | 2003-530705 A | 10/2003 |
| JP | 2004-129238 A | 4/2004 |
| JP | 2004-135322 A | 4/2004 |
| JP | 2004-173245 A | 6/2004 |
| JP | 4053504 B | 2/2008 |
| JP | 2009-130831 A | 6/2009 |
| JP | 2009-207116 A | 9/2009 |
| JP | 2013-243570 A | 12/2013 |
| WO | 2010/058544 A1 | 5/2010 |
| WO | 2012/114930 A1 | 8/2012 |

OTHER PUBLICATIONS

International search report of WO2015/119178A1 dated Apr. 28, 2015.
Office action issued in JP2015-561020 dated Aug. 8, 2017.

* cited by examiner

| COMMUNICATION BAND | FIRST BAND | SECOND BAND | THIRD BAND | FOURTH BAND |
|---|---|---|---|---|
| SELECTING PORTION SW1 | Psw1 | Psw1 | Psw3 | Psw3 |
| SELECTING PORTION SW2 | Psw2 | Psw2 | Psw4 | Psw4 |

US 9,780,760 B2

VARIABLE FILTER CIRCUIT AND WIRELESS COMMUNICATION APPARATUS

This application is a continuation of International Application No. PCT/JP2015/053171 filed on Feb. 5, 2015 which claims priority from Japanese Patent Application No. JP2014-202078 filed on Sep. 30, 2014 and Japanese Patent Application No. JP2014-023341 filed on Feb. 10, 2014. The contents of these applications are incorporated herein by reference in their entireties.

BACKGROUND

Technical Field

The present disclosure relates to a variable filter circuit and a wireless communication apparatus including the variable filter circuit.

Conventional variable filter circuits have been given ladder configurations, in which basic circuits are configured by connecting variable capacitances in parallel or in series to resonators such as SAW resonators or BAW resonators and such basic circuits are then combined in multiple stages (see Patent Document 1, for example). In the variable filter circuit, an anti-resonant frequency of each basic circuit is adjusted by controlling the variable capacitance connected in parallel to the resonator, and a resonant frequency of each basic circuit is adjusted by controlling both the variable capacitance connected in parallel and the variable capacitance connected in series to each resonator. A desired band can be set as a pass band as a result.

Patent Document 1: Japanese Patent No. 4053504

BRIEF SUMMARY

In a conventional variable filter circuit, although a pass band can be adjusted by controlling a variable capacitance, it has been difficult to obtain desired attenuation characteristics. Specifically, it has been difficult to obtain steep attenuation characteristics near a high-frequency side of the pass band. Additionally, because the frequency of the pass band is varied by connecting two variable capacitances to a single resonator, it is necessary to provide 2×n variable capacitances in the case where n resonators are provided, which tends to increase the total number of variable capacitances. This has led to an increase in the circuit size and complication of the control system.

Accordingly, the present disclosure provides a variable filter circuit and a wireless communication apparatus in which it is easy to obtain steep attenuation characteristics near a high-frequency side of a pass band and in which the circuit size is not easily increased and the control system is not easily complicated even when multiple stages are configured.

A variable filter circuit according to this disclosure includes a serial arm connected between a first input/output end and a second input/output end, a first parallel arm including a resonator connected in series between the first input/output end and a ground connection end, and a second parallel arm including a resonator connected in series between the second input/output end and the ground connection end.

In addition, the serial arm includes a first inductor connected in series between the first input/output end and the second input/output end. Steep attenuation characteristics near a high-frequency side of a pass band can be obtained by appropriately adjusting an inductance of the first inductor.

Additionally, each of the first and second parallel arms includes a variable reactance connected in series to the resonator. A cutoff frequency on a high-frequency side of a pass band can be adjusted by controlling the variable reactance, while keeping the steepness of the attenuation characteristics high near the high-frequency side of the pass band.

In order to increase the steepness of the attenuation characteristics of the filter in such a variable filter circuit, a serial arm and a parallel arm may be added, with one end of the added serial arm being connected to the first input/output end or the second input/output end, and another end of the serial arm being connected to the added parallel arm. Accordingly, even in the case where the variable filter circuit is configured having n stages of serial arms, the number of parallel arms and variable reactances need only be n+1, which makes it possible to suppress an increase in the circuit size and complication of the control system more than has been possible with conventional configurations.

The variable filter circuit according to this disclosure can further include a second inductor (called a serial inductor hereinafter) connected in series to each of the resonators. Connecting a serial inductor to the resonator in this manner adjusts a resonance point of the resonator further to the low-frequency side and widens a frequency interval between the resonance point and an anti-resonance point.

Additionally, the variable filter circuit according to this disclosure can further include a third inductor (called a parallel inductor hereinafter) connected in parallel to each of the resonators. Connecting a parallel inductor to the resonator in this manner adjusts the anti-resonance point of the resonator further to the high-frequency side and widens a frequency interval between the resonance point and the anti-resonance point.

When the frequency interval between the resonance point and the anti-resonance point of the resonator is widened in this manner, a range of variation of the cutoff frequency on the high-frequency side of the pass band, that can be adjusted by controlling the variable reactance, is widened as well.

The variable filter circuit according to this disclosure may be configured to include a third inductor connected in parallel to the resonator and a second inductor connected in series to a circuit in which the resonator and the third inductor are connected in parallel. Additionally, the variable filter circuit according to this disclosure may be configured to include a second inductor connected in series to the resonator and a third inductor connected in parallel to a circuit in which the resonator and the second inductor are connected in series. By changing the connection configuration of the second inductor (the serial inductor) and the third inductor (the parallel inductor) in this manner, adjustments such as adjusting the range of variation of the cutoff frequency on the high-frequency side of the pass band, making the attenuation characteristics steeper near the high-frequency side of the pass band, and so on can be made.

Additionally, the variable filter circuit according to this disclosure can further include a switch that switches a connection state of the parallel inductor on or off. Through this, the bandpass characteristics are changed by switching the connection state of the parallel inductor.

The variable filter circuit according to this disclosure may be configured so that each of the first parallel arm and the second parallel arm further includes a third inductor (parallel inductor) connected in parallel to the resonator, the first parallel arm includes a second inductor (serial inductor) connected in series to the resonator, and the second parallel arm does not include a second inductor (serial inductor) connected in series to the resonator. Employing such a configuration makes it possible to reduce the circuit size by an amount corresponding to omitting the serial inductor from the second parallel arm, as compared to a case where both the first parallel arm and the second parallel arm are provided with a serial inductor and a parallel inductor. In such a case, a resonance point and an anti-resonance point of the resonator included in the first parallel arm can be further on a high-frequency side than a resonance point and an anti-resonance point of the resonator included in the second parallel arm. Additionally, an inductance of the parallel inductor included in the second parallel arm can be lower than an inductance of the parallel inductor included in the first parallel arm. Doing so makes it possible to suppress a significant degradation in the filter characteristics of the variable filter circuit, a significant narrowing of the range of variation of the cutoff frequency, and so on, even if the serial inductor is omitted from the second parallel arm.

The variable filter circuit according to this disclosure may be configured to include a plurality of the resonators and a selecting portion that selects one of the plurality of resonators and connects the selected resonator in series to the variable reactance. Additionally, the filter circuit may be configured including a plurality of second inductors, a plurality of third inductors, or the like, with one of the inductors being selected along with a resonator by the selecting portion and connected in series to the variable reactance. In such a case, having the respective resonators handle different communication bands makes it possible for the variable filter circuit to handle many communication bands, and makes it possible to select a communication band through control of the selecting portion. Although it is normally necessary to provide substantially the same number of parallel arms as the number of the communication bands in order for the variable filter circuit to be capable of handling many communication bands, providing the selecting portion as described above and selecting the resonator to connect to the variable reactance eliminate the need to provide a parallel arm for each communication band, and make it possible to share a variable reactance among several communication bands. Accordingly, the total number of variable reactances can be suppressed, and an increase in the circuit size, complication of the variable reactance control, and the like can be suppressed.

A wireless communication apparatus according to this disclosure can include a front end circuit including the above-described variable filter circuit, an antenna, and a communication circuit connected to the antenna with the front end circuit provided therebetween. In particular, in the wireless communication apparatus, it is desirable that the communication circuit handle a plurality of communication bands, and that an anti-resonance point in the case where at least one of the parallel arms does not include the variable reactance be higher than an upper limit frequency on a high-frequency side of a stop band of the communication band, among the plurality of communication bands, that is furthest on the high-frequency side. Additionally, it is desirable that a resonance point in the case where at least one of the parallel arms does not include the variable reactance be lower than a lower limit frequency on a low-frequency side of a stop band of the communication band, among the plurality of communication bands, that is furthest on the low-frequency side.

It is necessary to provide a stop band and a pass band in each of the plurality of communication bands handled by the communication circuit. Setting the relationships between the resonance points and anti-resonance points of each parallel arm and the plurality of communication bands as described above makes it possible to adjust the cutoff frequency on the high-frequency side of the pass band of the variable filter circuit to the high-frequency side of the pass bands of each of the plurality of communication bands handled by the communication circuit. Additionally, in the case where the stop band of the communication band is located near the high-frequency side of the pass band, the variable filter circuit can achieve a large attenuation with respect to that stop band.

Alternatively, in the wireless communication apparatus, it is desirable that the variable filter circuit include a second inductor connected in series to each of the resonators in the parallel arm, the communication circuit handle a plurality of communication bands, and a sub-resonance point in the case where at least one of the parallel arms does not include the variable reactance be lower than a lower limit frequency on a low-frequency side of a stop band of the communication band, among the plurality of communication bands, that is furthest on the low-frequency side.

When a serial inductor is connected to the resonator, a resonance point also appears further on the high-frequency side than the anti-resonance point of the resonator (called a sub-resonance point). In this case, in the bandpass characteristics, a second pass band arises on the high-frequency side in addition to the first pass band on the low-frequency side. The cutoff frequency on the high-frequency side can be adjusted for second pass band on the high-frequency side as well by controlling the variable reactance. Setting the relationship between the plurality of communication bands and the sub-resonance points in each parallel arm as described above makes it possible to adjust the second pass band on the high-frequency side of the variable filter circuit to the pass bands of the plurality of communication bands handled by the communication circuit.

According to the present disclosure, steep attenuation characteristics can be achieved near a high-frequency side of a pass band, and a cutoff frequency on the high-frequency side of the pass band can be adjusted by controlling a variable reactance. As such, even in the case where a variable filter circuit is configured having n stages of serial arms, the number of variable reactances need only be n+1, which makes it possible to suppress an increase in the circuit size and complication of the control system more than has been possible with conventional configurations.

DETAILED DESCRIPTION

Figure 1:
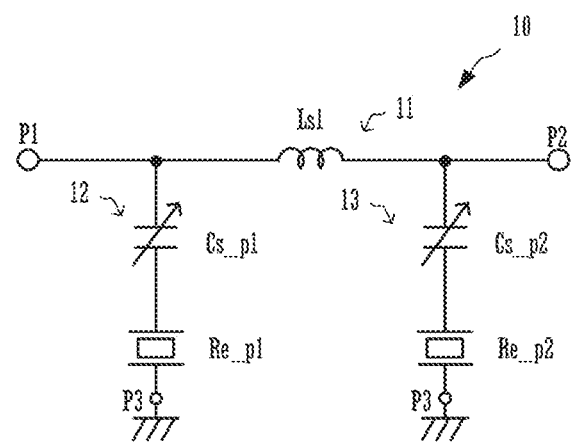
FIG. 1 is a circuit diagram of a variable filter circuit according to a first embodiment.

Several embodiments for carrying out the present disclosure will be described hereinafter with reference to the drawings, using several specific examples. Corresponding elements in the drawings are given the same reference numerals. It goes without saying that the embodiments are merely examples, and that configurations described in different embodiments can partially replace each other or be combined as well.

First Embodiment

FIG. 1 is a circuit diagram illustrating a variable filter circuit 10 according to a first embodiment of the present disclosure.

The variable filter circuit 10 includes ports P1, P2, and P3, a serial arm 11, and parallel arms 12 and 13. The port P1 is a first input/output end of the variable filter circuit 10. The port P2 is a second input/output end of the variable filter circuit 10. The port P3 is a ground connection end of the variable filter circuit 10. The serial arm 11 is connected in series between the port P1 and the port P2. The parallel arm 12 is connected in series between the port P1 and the port P3. The parallel arm 13 is connected in series between the port P2 and the port P3.

The serial arm 11 includes a first inductor Ls1. The first inductor Ls1 is provided between the port P1 and the port P2, with one end thereof connected to one end of the parallel arm 12 and another end thereof connected to one end of the parallel arm 13. The parallel arm 12 includes a resonator Re_p1 and a variable capacitance Cs_p1. The variable capacitance Cs_p1 corresponds to a variable reactance according to the claims, and one end thereof is connected to the port P1. One end of the resonator Re_p1 is connected to the port P3. Another end of the variable capacitance Cs_p1 and another end of the resonator Re_p1 are connected to each other. The parallel arm 13 includes a resonator Re_p2 and a variable capacitance Cs_p2. The variable capacitance Cs_p2 corresponds to a variable reactance according to the claims, and one end thereof is connected to the port P2. One end of the resonator Re_p2 is connected to the port P3. Another end of the variable capacitance Cs_p2 and another end of the resonator Re_p2 are connected to each other.

The element values, characteristics, and so on of the first inductor Ls1, the resonators Re_p1 and Re_p2, and the variable capacitances Cs_p1 and Cs_p2 can be set as appropriate.

The following descriptions assume that the resonator Re_p1 and the resonator Re_p2 are both surface acoustic wave resonators having a resonance point Mfr at a frequency of approximately 885 MHz and an anti-resonance point Mfa at a frequency of approximately 915 MHz, and that the first inductor Ls1 is a fixed inductance at approximately 8 nH.

Figure 2A:
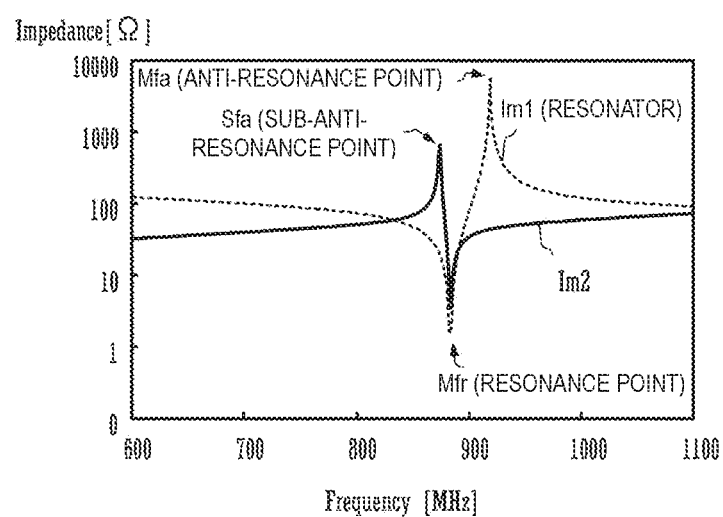
FIGS. 2A and 2B illustrate characteristic graphs indicating a function of a first inductor that constitutes the variable filter circuit according to the first embodiment.

FIG. 2A is an impedance characteristic graph illustrating a function of the first inductor Ls1. The dotted line in FIG. 2A indicates impedance characteristics Im1 for the resonator Re_p1 alone. The solid line in FIG. 2A, meanwhile, indicates impedance characteristics Im2 of the resonator Re_p1 in a state where the first inductor Ls1 is connected.

Comparing the impedance characteristics Im2 when the first inductor Ls1 is provided with the impedance characteristics Im1 when the first inductor Ls1 is omitted, the frequency of the resonance point Mfr is the same at approximately 885 MHz, but the anti-resonance point Mfa that was at a frequency of approximately 915 MHz in the impedance characteristics Im1 has moved from the frequency of 915 MHz in the impedance characteristics Im2. Additionally, in the impedance characteristics Im2, a sub-anti-resonance point Sfa appears at a nearby frequency further on a low-frequency side than the resonance point Mfr, namely approximately 870 MHz.

Accordingly, the first inductor Ls1 has a function of moving the anti-resonance point of the resonator Re_p1 in the parallel arm 12 from the high-frequency side to the low-frequency side of the resonance point Mfr. Note that the first inductor Ls1 has the same function for the resonator Re_p2 of the parallel arm 13 as well.

Figure 2B:
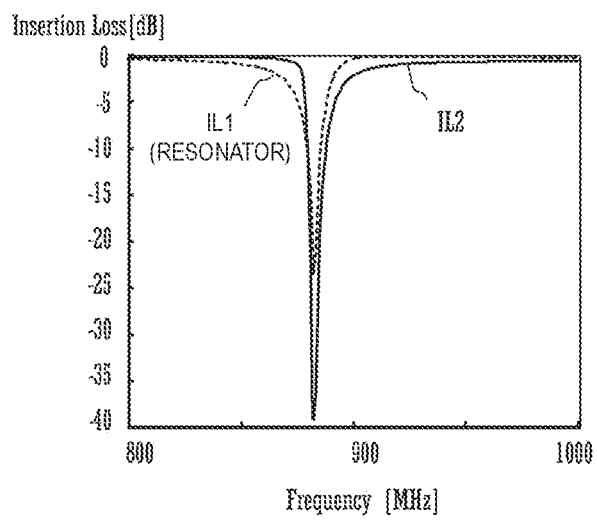

FIG. 2B is a bandpass characteristic graph illustrating a function of the first inductor Ls1. The dotted line in FIG. 2B represents bandpass characteristics IL1 in the case where the first inductor Ls1 and the variable capacitances Cs_p1 and Cs_p2 are omitted and only the resonators Re_p1 and Re_p2 are provided. The solid line in FIG. 2B, meanwhile, represents bandpass characteristics IL2 in the case where the variable capacitances Cs_p1 and Cs_p2 are omitted and only the first inductor Ls1 and the resonators Re_p1 and Re_p2 are provided.

Comparing the bandpass characteristics IL2 when the first inductor Ls1 is provided with the bandpass characteristics IL1 when the first inductor Ls1 is omitted, in the pass band in the bandpass characteristics IL2 located further on the low-frequency side than the resonance point Mfr, attenuation characteristics near the high-frequency side of the pass band are steeper than in the bandpass characteristics IL1. This is because, as described earlier, the sub-anti-resonance point Sfa appears near the low-frequency side of the resonance point Mfr in the impedance characteristics Im2. Note that the attenuation characteristics tend to become steeper as the inductance of the first inductor Ls1 increases, and an attenuation level in the attenuation characteristics tends to improve as the inductance of the first inductor Ls1 decreases.

Accordingly, providing the first inductor Ls1 makes it possible to improve the steepness of the attenuation characteristics near the high-frequency side of the pass band located further on the low-frequency side than the resonance point Mfr.

Figure 3:
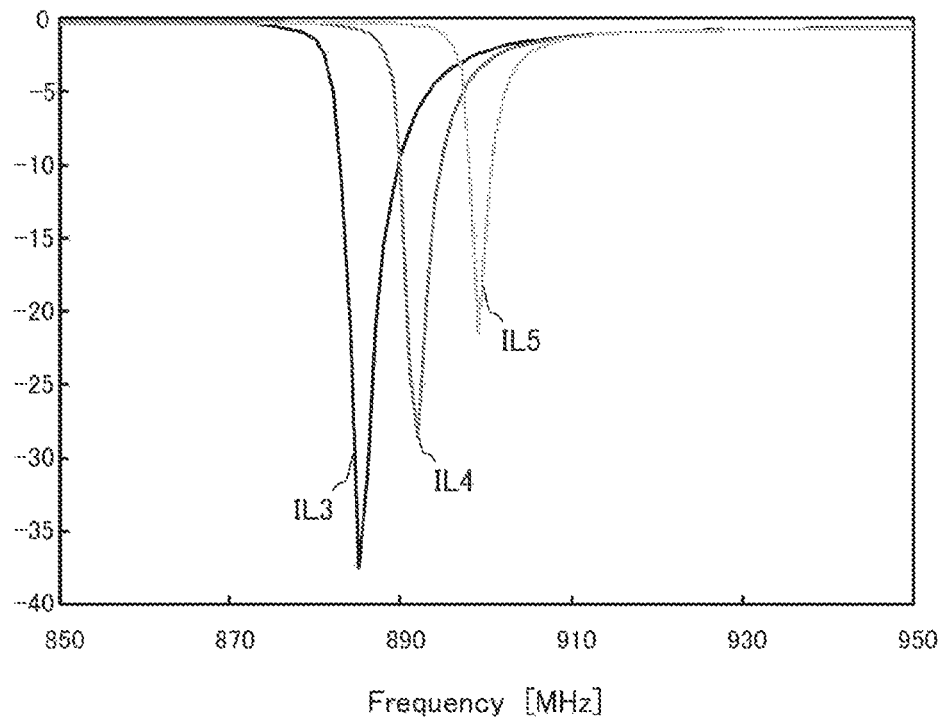
FIG. 3 illustrates a characteristic graph indicating a function of a variable capacitance that constitutes the variable filter circuit according to the first embodiment.

FIG. 3 is a bandpass characteristic graph illustrating the function of the variable capacitance Cs_p1 in the parallel arm 12. Bandpass characteristics IL3, IL4, and IL5 of the variable filter circuit 10, represented by the solid lines in FIG. 3, are set so that the capacitances of the variable capacitance Cs_p1 are different. In the bandpass characteristics IL3, the variable capacitance Cs_p1 is at 10.0 pF. In the bandpass characteristics IL4, the variable capacitance Cs_p1 is at 2.5 pF. In the bandpass characteristics IL5, the variable capacitance Cs_p1 is at 1.0 pF.

Here, by controlling the capacitance of the variable capacitance Cs_p1 between 1.0 pF and 10.0 pF, a cutoff frequency on the high-frequency side of the pass band located further on the low-frequency side than the resonance point Mfr can be adjusted in a band of approximately 15 MHz (885 to 900 MHz). Specifically, the cutoff frequency on the high-frequency side of the pass band can be adjusted further to the high-frequency side by controlling the capacitance of the variable capacitance Cs_p1 to decrease. The cutoff frequency on the high-frequency side of the pass band can be adjusted further to the low-frequency side by controlling the capacitance of the variable capacitance Cs_p1 to increase.

However, the cutoff frequency on the high-frequency side of the pass band located further on the low-frequency side than the resonance point Mfr cannot be adjusted to the high-frequency side beyond a predetermined frequency (approximately 915 MHz) even if the capacitance of the variable capacitance Cs_p1 has been controlled to an extremely low value. More specifically, a range of variation of the cutoff frequency on the high-frequency side of the pass band is limited to a band between the resonance point Mfr and the anti-resonance point Mfa for the case where the variable capacitance Cs_p1 is omitted, namely approximately 30 MHz (885 to 915 MHz).

Although the function of the variable capacitance Cs_p1 in the parallel arm 12 has been described here, the same applies to the function of the variable capacitance Cs_p2 in the parallel arm 13.

As described thus far, in the variable filter circuit 10, the cutoff frequency on the high-frequency side of the pass band can be adjusted by controlling the variable capacitances Cs_p1 and Cs_p2, in a state where the steepness of the attenuation characteristics near the high-frequency side of the pass band is increased by providing the first inductor Ls1.

In this variable filter circuit 10, the number of stages of serial arms, parallel arms, and the like that constitute the filter may be increased in order to increase the steepness of the attenuation characteristics of the filter. For example, a serial arm 14 and a parallel arm 15 may be newly added, with one end of the added serial arm 14 being connected to the port P1 or the port P2 and another end of the added serial arm 14 being connected to the parallel arm 15. At this time, a variable capacitance Cs_p3 of the added parallel arm 15 may be replaced with a fixed capacitance whose capacitance value does not change. Accordingly, even in the case where the variable filter circuit 10 is configured having n stages of serial arms, the total number of parallel arms and variable capacitances is a maximum of n+1, which makes it possible to suppress an increase in the circuit size and complication of the control system more than has been possible with conventional configurations. The variable filter circuit 10 according to the present embodiment may also have n+1 parallel arms and n serial arms provided.

Second Embodiment

Figure 4:
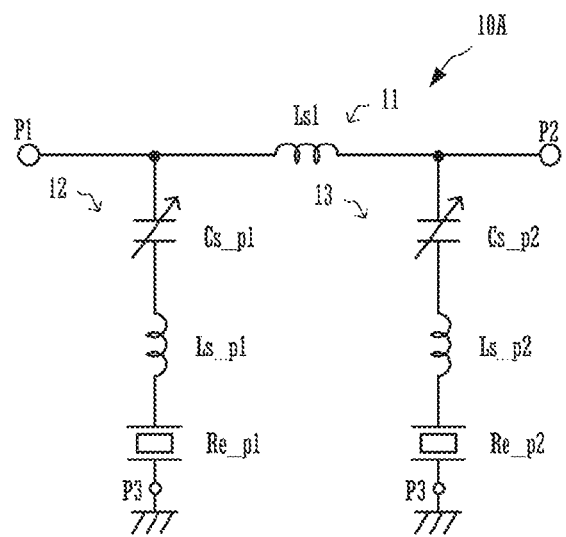
FIG. 4 is a circuit diagram of a variable filter circuit according to a second embodiment.

FIG. 4 is a circuit diagram illustrating a variable filter circuit 10A according to a second embodiment.

The variable filter circuit 10A has almost the same configuration as in the above-described first embodiment, but the parallel arms 12 and 13 include serial inductors (second inductors) Ls_p1 and Ls_p2 in addition to the resonators Re_p1 and Re_p2 and the variable capacitances Cs_p1 and Cs_p2. The serial inductor Ls_p1 is connected in series between the resonator Re_p1 and the variable capacitance Cs_p1. The serial inductor Ls_p2 is connected in series between the resonator Re_p2 and the variable capacitance Cs_p2.

The following descriptions assume that the serial inductors Ls_p1 and Ls_p2 are both at fixed inductances of approximately 50 nH. Aside from this, the resonators Re_p1 and Re_p2, the variable capacitances Cs_p1 and Cs_p2, the first inductor Ls1, and so on are assumed to have the same element values as in the first embodiment.

Figure 5A:
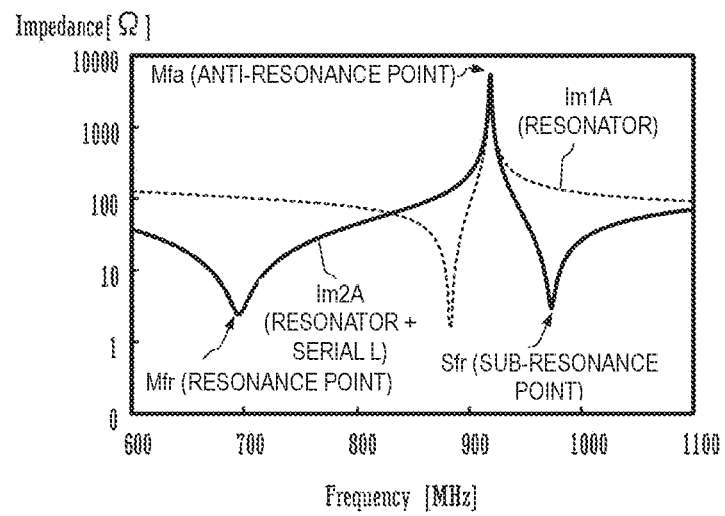
FIGS. 5A and 5B illustrate characteristic graphs indicating a function of a serial inductor that constitutes the variable filter circuit according to the second embodiment.

FIG. 5A is an impedance characteristic graph illustrating a function of the serial inductor Ls_p1. The dotted line in FIG. 5A indicates impedance characteristics Im1A for the resonator Re_p1. The solid line in FIG. 5A, meanwhile, indicates impedance characteristics Im2A of the resonator Re_p1 in a state where the serial inductor Ls_p1 is connected.

Comparing the impedance characteristics Im2A when the serial inductor Ls_p1 is provided with the impedance characteristics Im1A when the serial inductor Ls_p1 is omitted, the frequency of the anti-resonance point Mfa is the same at approximately 915 MHz, but the resonance point Mfr that was at a frequency of approximately 885 MHz in the impedance characteristics Im1A has moved to a frequency of approximately 690 MHz further on the low-frequency side in the impedance characteristics Im2A. Additionally, in the impedance characteristics Im2A, a sub-resonance point Sfr appears at a frequency of approximately 970 MHz near the high-frequency side of the anti-resonance point Mfa.

In this manner, the serial inductor Ls_p1 in the parallel arm 12 has a function of moving the resonance point Mfr to the low-frequency side and a function of producing the sub-resonance point Sfr further on the high-frequency side than the anti-resonance point Mfa. Note that the serial inductor Ls_p2 in the parallel arm 13 has the same function.

Figure 5B:
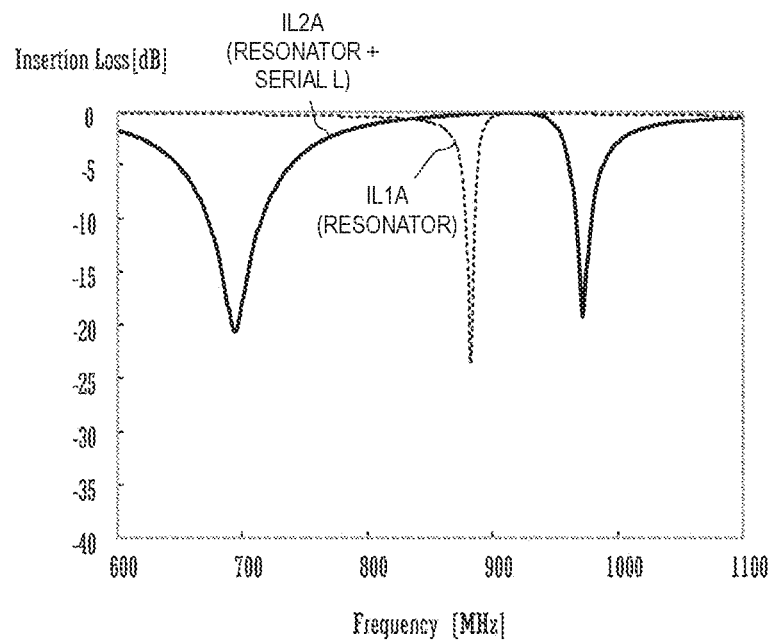

FIG. 5B is a bandpass characteristic graph illustrating a function of the serial inductors Ls_p1 and Ls_p2. The dotted line in FIG. 5B represents bandpass characteristics IL1A in the case where the first inductor Ls1, the variable capacitances Cs_p1 and Cs_p2, and the serial inductors Ls_p1 and Ls_p2 are omitted and only the resonators Re_p1 and Re_p2 are provided. The solid line in FIG. 5B, meanwhile, represents bandpass characteristics IL2A in the case where the first inductor Ls1 and the variable capacitances Cs_p1 and Cs_p2 are omitted and only the resonators Re_p1 and Re_p2 and the serial inductors Ls_p1 and Ls_p2 are provided.

Comparing the bandpass characteristics IL2A when the serial inductors Ls_p1 and Ls_p2 are provided and the bandpass characteristics IL1A when the serial inductors Ls_p1 and Ls_p2 are omitted, an attenuation pole appearing at the resonance point Mfr in the bandpass characteristics IL1A has moved further to the low-frequency side in the bandpass characteristics IL2A. Accordingly, a pass band appearing further on the low-frequency side than the resonance point Mfr, and a cutoff frequency on the high-frequency side thereof, have also moved to the low-frequency side. Meanwhile, in the bandpass characteristics IL2A, in a second pass band further on the high-frequency side than the resonance point Mfr, the cutoff frequency on the low-frequency side moves further to the low-frequency side and a cutoff frequency also appears on the high-frequency side. This is because, as described earlier, in the impedance characteristics Im2A, the resonance point Mfr appears further on the low-frequency side and the sub-resonance point Sfr newly appears.

In this manner, in the variable filter circuit 10A, the serial inductors Ls_p1 and Ls_p2 have a function of moving a cutoff frequency on the high-frequency side of a first pass band to the low-frequency side and a function of producing the second pass band in addition to the first pass band.

Figure 6A:
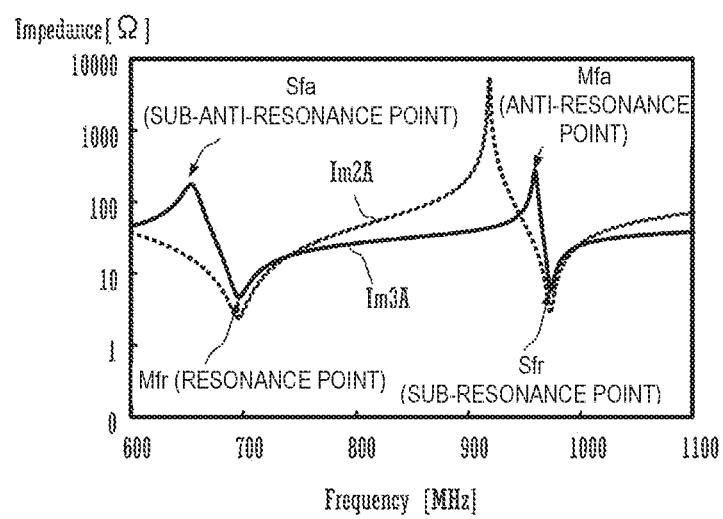
FIGS. 6A and 6B illustrate characteristic graphs indicating functions of a first inductor that constitutes the variable filter circuit according to the second embodiment.

FIG. 6A is an impedance characteristic graph illustrating a function of the first inductor Ls1 in the variable filter circuit 10A. The dotted line in FIG. 6A indicates the impedance characteristics Im2A of the resonator Re_p1 in a state where the serial inductor Ls_p1 is connected. The solid line in FIG. 6A, meanwhile, indicates impedance characteristics Im3A of the resonator Re_p1 in a state where the serial inductor Ls_p1 and the first inductor Ls1 are connected.

Comparing the impedance characteristics Im3A when the first inductor Ls1 is provided with the impedance characteristics Im2A when the first inductor Ls1 is omitted, the frequency of the resonance point Mfr is the same at approximately 690 MHz and the frequency of the sub-resonance point Sfr is also the same at approximately 970 MHz, but the anti-resonance point Mfa that was at a frequency of approximately 915 MHz in the impedance characteristics Im2A has moved to a frequency further on the high-frequency side of approximately 930 MHz in the impedance characteristics Im3A. Additionally, in the impedance characteristics Im3A, the sub-anti-resonance point Sfa appears at a frequency near the low-frequency side of the resonance point Mfr, namely approximately 660 MHz.

Figure 6B:
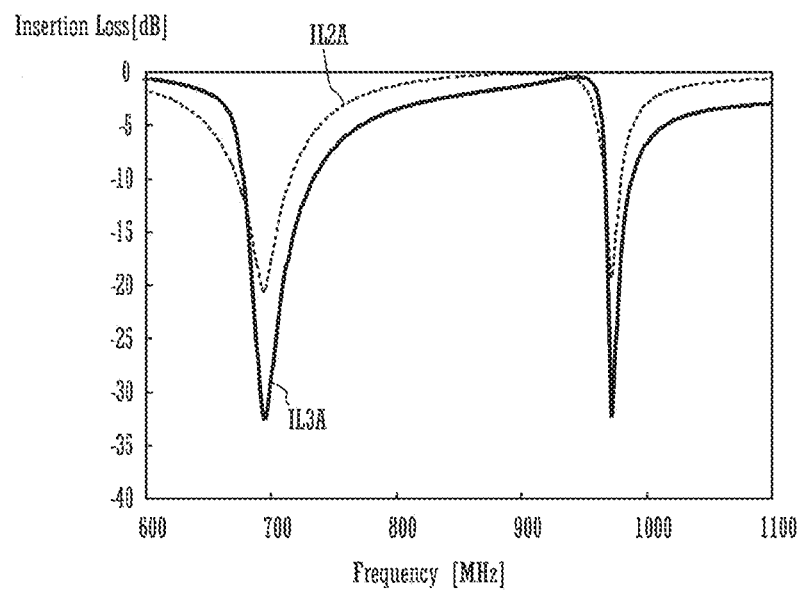

FIG. 6B is a bandpass characteristic graph illustrating a function of the first inductor Ls1 in the variable filter circuit 10A. The dotted line in FIG. 6B represents the bandpass characteristics IL2A in the case where the first inductor Ls1 and the variable capacitances Cs_p1 and Cs_p2 are omitted and only the resonators Re_p1 and Re_p2 and the serial inductors Ls_p1 and Ls_p2 are provided. The solid line in FIG. 6B, meanwhile, represents bandpass characteristics IL3A in the case where the variable capacitances Cs_p1 and Cs_p2 are omitted and only the resonators Re_p1 and Re_p2, the serial inductors Ls_p1 and Ls_p2, and the first inductor Ls1 are provided.

Comparing the bandpass characteristics IL3A when the first inductor Ls1 is provided with the bandpass characteristics IL2A when the first inductor Ls1 is omitted, in the first pass band further on the low-frequency side than the resonance point Mfr, the attenuation characteristics near the high-frequency side are steeper in the bandpass characteristics IL3A than in the bandpass characteristics IL2A. In addition, in the second pass band further on the high-frequency side than the resonance point Mfr as well, the attenuation characteristics near the high-frequency side are steeper in the bandpass characteristics IL3A than in the bandpass characteristics IL2A. This is because, as described earlier, the sub-anti-resonance point Sfa appears near the low-frequency side of the resonance point Mfr in the impedance characteristics Im3A, and the anti-resonance point Mfa moves to near the low-frequency side of the sub-resonance point Sfr.

In this manner, in the variable filter circuit 10A, the first inductor Ls1 has a function of making the attenuation characteristics steep near the high-frequency side of the first and second pass bands.

Figure 7:
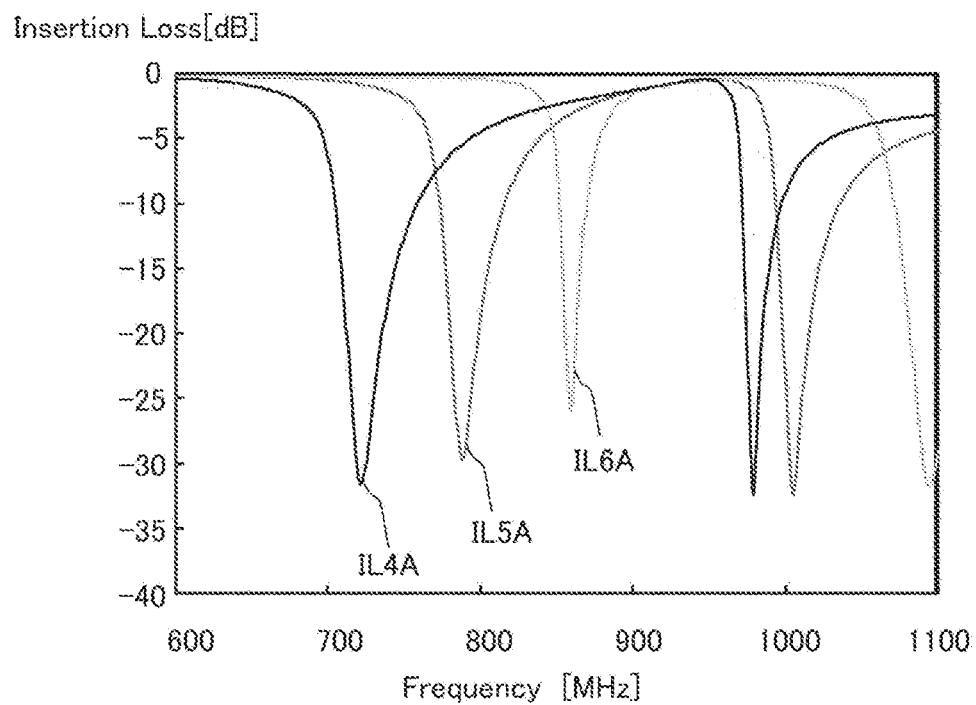
FIG. 7 illustrates a characteristic graph indicating a function of a variable capacitance that constitutes the variable filter circuit according to the second embodiment.

FIG. 7 is a bandpass characteristic graph illustrating a function of the variable capacitances Cs_p1 and Cs_p2 in the variable filter circuit 10A. Of the bandpass characteristics IL4A, IL5A, and IL6A indicated by the solid lines in FIG. 7, the variable capacitances Cs_p1 and Cs_p2 are at 10.0 pF in the bandpass characteristics IL4A. In the bandpass characteristics IL5A, the variable capacitances Cs_p1 and Cs_p2 are at 2.5 pF. In the bandpass characteristics IL6A, the variable capacitances Cs_p1 and Cs_p2 are at 1.0 pF.

Here, by controlling the capacitances of the variable capacitances Cs_p1 and Cs_p2 between 1.0 pF and 10.0 pF, a cutoff frequency on the high-frequency side of the first pass band on the low-frequency side is successfully adjusted in a band of approximately 150 MHz (690 to 840 MHz). Likewise, the cutoff frequency on the high-frequency side of the second pass band on the high-frequency side is successfully adjusted in a band of approximately 90 MHz (970 to 1060 MHz). In this manner, the cutoff frequency on the high-frequency side of the first pass band and the cutoff frequency on the high-frequency side of the second pass band can, by controlling the variable capacitances Cs_p1 and Cs_p2, be adjusted in a state where the steepness of the attenuation characteristics near the high-frequency sides thereof is increased.

In this manner, in the variable filter circuit 10A, the variable capacitances Cs_p1 and Cs_p2 have a function of adjusting the cutoff frequencies on the high-frequency sides of the first and second pass bands.

However, as described in the first embodiment, the range of variation of the cutoff frequency on the high-frequency side of the first pass band is limited to a band between the resonance point Mfr and the anti-resonance point Mfa for the case where the variable capacitances Cs_p1 and Cs_p2 are omitted, in the configuration according to the second embodiment as well. However, as described earlier, providing the serial inductors Ls_p1 and Ls_p2 makes it possible to widen the band between the resonance point Mfr and the anti-resonance point Mfa in a state where the variable capacitances Cs_p1 and Cs_p2 are not provided, which in turn makes it possible to widen the range of variation of the cutoff frequency on the high-frequency side of the first pass band. In the present embodiment, a frequency interval between the resonance point Mfr and the anti-resonance point Mfa is widened to a band width of approximately 270 MHz (690 MHz to 960 MHz), which is wider than the band width of approximately 30 MHz in the first embodiment, and the range of variation of the cutoff frequency on the high-frequency side of the first pass band is successfully widened.

In this manner, according to the variable filter circuit 10A, the range of variation of the cutoff frequency on the high-frequency side of the first pass band can be widened, and furthermore, the first pass band is present on the low-frequency side and the second pass band is present on the high-frequency side; as such, the range of the pass bands that can be handled can be widened by using these two pass bands together.

Third Embodiment

Figure 8:
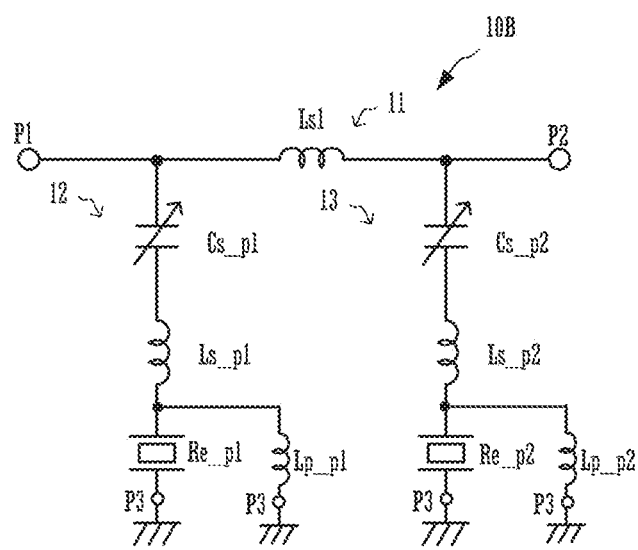
FIG. 8 is a circuit diagram of a variable filter circuit according to a third embodiment.

FIG. 8 is a circuit diagram illustrating a variable filter circuit 10B according to a third embodiment.

The variable filter circuit 10B has almost the same configuration as in the above-described second embodiment, but the parallel arms 12 and 13 include parallel inductors (third inductors) Lp_p1 and Lp_p2 in addition to the resonators Re_p1 and Re_p2, the serial inductors Ls_p1 and Ls_p2, and the variable capacitances Cs_p1 and Cs_p2. The parallel inductor Lp_p1 is connected in parallel to the resonator Re_p1, with one end thereof being connected to a connection point between the serial inductor Ls_p1 and the resonator Re_p1 and another end thereof being connected to the port P3. The parallel inductor Lp_p2 is connected in parallel to the resonator Re_p2, with one end thereof being connected to a connection point between the serial inductor Ls_p2 and the resonator Re_p2 and another end thereof being connected to the port P3.

The following descriptions assume that the resonators Re_p1 and Re_p2 are both surface acoustic wave resonators having resonant frequencies of approximately 835 MHz and anti-resonant frequencies of approximately 865 MHz. The parallel inductors Lp_p1 and Lp_p2 are both assumed to be fixed inductances at approximately 5 nH. Aside from this, the variable capacitances Cs_p1 and Cs_p2, the first inductor Ls1, the serial inductors Ls_p1 and Ls_p2, and so on are assumed to have the same element values as in the second embodiment.

Figure 9A:
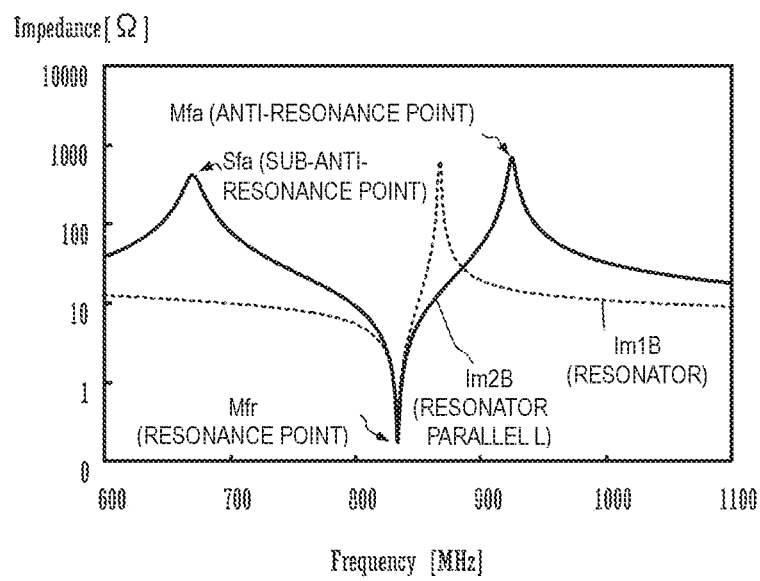
FIGS. 9A and 9B illustrate characteristic graphs indicating functions of parallel inductor and a serial inductor that constitute the variable filter circuit according to the third embodiment.

FIG. 9A is an impedance characteristic graph illustrating a function of the parallel inductor Lp_p1. The dotted line in FIG. 9A indicates impedance characteristics Im1B for the resonator Re_p1 alone. The solid line in FIG. 9A, meanwhile, indicates impedance characteristics Im2B of the resonator Re_p1 in a state where the parallel inductor Lp_p1 is connected.

Comparing the impedance characteristics Im2B when the parallel inductor Lp_p1 is provided with the impedance characteristics Im1B when the parallel inductor Lp_p1 is omitted, the frequency of the resonance point Mfr is the same at approximately 835 MHz, but the anti-resonance point Mfa that was at a frequency of approximately 865 MHz in the impedance characteristics Im1B has moved to a frequency further on the high-frequency side, namely approximately 920 MHz, in the impedance characteristics Im2B. Additionally, in the impedance characteristics Im2B, the sub-anti-resonance point Sfa appears at a frequency near the low-frequency side of the resonance point Mfr, namely approximately 660 MHz.

In this manner, the parallel inductor Lp_p1 in the parallel arm 12 has a function of moving the anti-resonance point Mfa to the high-frequency side and a function of producing the sub-anti-resonance point Sfa further on the low-frequency side than the resonance point Mfr. Note that the parallel inductor Lp_p2 in the parallel arm 13 has the same function.

Figure 9B:
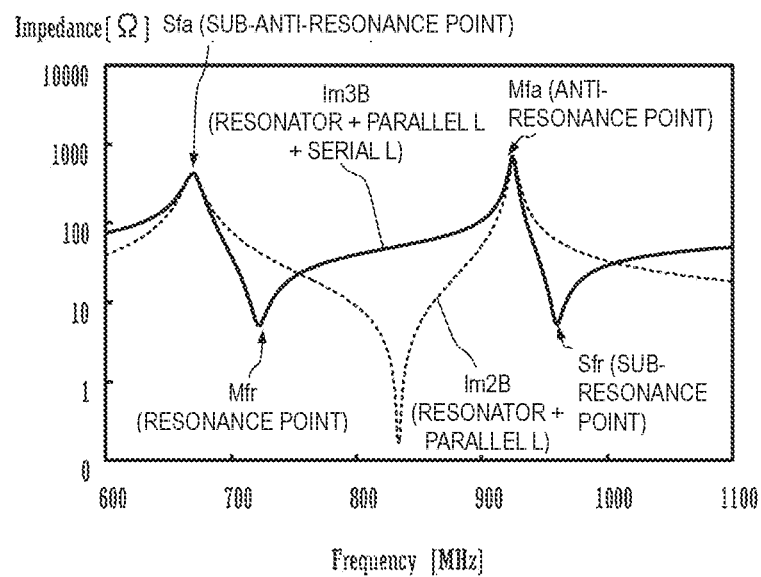

FIG. 9B is an impedance characteristic graph illustrating a function of the serial inductor Ls_p1 in the variable filter circuit 10B. The dotted line in FIG. 9B indicates the impedance characteristics Im2B of the resonator Re_p1 in a state where the parallel inductor Lp_p1 is connected. The solid line in FIG. 9B, meanwhile, indicates impedance characteristics Im3B of the resonator Re_p1 in a state where the parallel inductor Lp_p1 and the serial inductor Ls_p1 are connected.

Comparing the impedance characteristics Im3B when the serial inductor Ls_p1 is provided with the impedance characteristics Im2B when the serial inductor Ls_p1 is omitted, the frequency of the anti-resonance point Mfa is the same at approximately 920 MHz, but the resonance point Mfr that was at a frequency of approximately 835 MHz in the impedance characteristics Im2B has moved to a frequency of approximately 710 MHz further on the low-frequency side in the impedance characteristics Im3B. Additionally, in the impedance characteristics Im3B, the sub-resonance point Sfr appears at a frequency of approximately 950 MHz near the high-frequency side of the anti-resonance point Mfa.

In this manner, in the variable filter circuit 10B as well, the serial inductors Ls_p1 and Ls_p2 have a function of moving a cutoff frequency on the high-frequency side of the pass band to the low-frequency side and a function of producing the second pass band in addition to the first pass band.

Figure 10A:
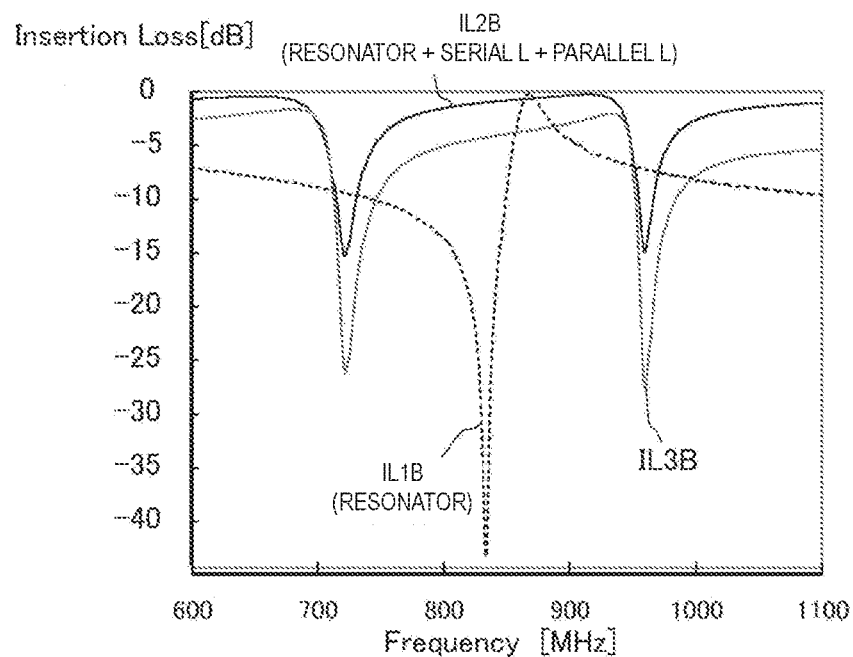
FIGS. 10A and 10B illustrate characteristic graphs indicating functions of a first inductor and a variable capacitance that constitute the variable filter circuit according to the third embodiment.

FIG. 10A is a bandpass characteristic graph illustrating a function of the first inductor Ls1 in the variable filter circuit 10B. The dotted line in FIG. 10A represents bandpass characteristics IL1B in the case where the first inductor Ls1, the variable capacitances Cs_p1 and Cs_p2, the serial inductors Ls_p1 and Ls_p2, and the parallel inductors Lp_p1 and Lp_p2 are omitted, and only the resonators Re_p1 and Re_p2 are provided. The solid lines in FIG. 10A, meanwhile, represent bandpass characteristics IL2B in the case where the first inductor Ls1 and the variable capacitances Cs_p1 and Cs_p2 are omitted and only the resonators Re_p1 and Re_p2, the serial inductors Ls_p1 and Ls_p2, and the parallel inductors Lp_p1 and Lp_p2 are provided, and bandpass characteristics IL3B in the case where the variable capacitances Cs_p1 and Cs_p2 are omitted and only the resonators Re_p1 and Re_p2, the serial inductors Ls_p1 and Ls_p2, the parallel inductors Lp_p1 and Lp_p2, and the first inductor Ls1 are provided.

Comparing the bandpass characteristics IL2B when the serial inductors Ls_p1 and Ls_p2 and the parallel inductors Lp_p1 and Lp_p2 are provided with the bandpass characteristics IL1B when the serial inductors Ls_p1 and Ls_p2 and the parallel inductors Lp_p1 and Lp_p2 are omitted, with respect to the first pass band that appeared further on the low-frequency side than the resonance point Mfr in the bandpass characteristics IL1B, a cutoff frequency on the high-frequency side has moved to the low-frequency side in the bandpass characteristics IL2B. Meanwhile, with respect to the second pass band that appeared further on the high-frequency side than the resonance point Mfr in the bandpass characteristics IL1B, the cutoff frequency of the low-frequency side has moved to the low-frequency side and a cutoff frequency appears on the high-frequency side in the bandpass characteristics IL2B. This is because as described earlier, in the impedance characteristics Im3B, the resonance point Mfr moves further on the low-frequency side and the sub-resonance point Sfr newly appears.

Additionally, comparing the bandpass characteristics IL3B when the first inductor Ls1 is provided with the bandpass characteristics IL2B when the first inductor Ls1 is omitted, the attenuation characteristics near the high-frequency side in the first pass band further on the low-frequency side than the resonance point Mfr are steeper in the bandpass characteristics IL3B than in the bandpass characteristics IL2B. Furthermore, in the second pass band further on the high-frequency side than the resonance point Mfr as well, the attenuation characteristics near the high-frequency side are steeper in the bandpass characteristics IL3B than in the bandpass characteristics IL2B.

In this manner, in the variable filter circuit 10B, the first inductor Ls1 has a function of making the attenuation characteristics steep near the high-frequency side of the first and second pass bands.

Figure 10B:
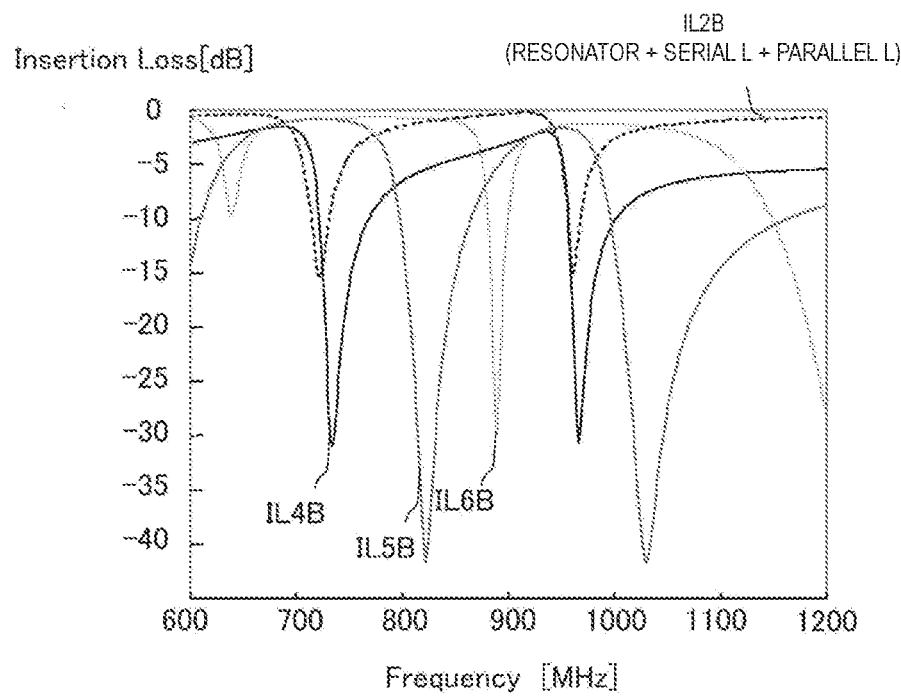

FIG. 10B is a bandpass characteristic graph illustrating a function of the variable capacitances Cs_p1 and Cs_p2 in the variable filter circuit 10B. The dotted line in FIG. 10B represents the bandpass characteristics IL2B in the case where the first inductor Ls1 and the variable capacitances Cs_p1 and Cs_p2 are omitted and only the resonators Re_p1 and Re_p2, the serial inductors Ls_p1 and Ls_p2, and the parallel inductors Lp_p1 and Lp_p2 are provided. The solid lines in FIG. 10B, meanwhile, represent bandpass characteristics IL4B, IL5B, and IL6B in the case where the resonators Re_p1 and Re_p2, the serial inductors Ls_p1 and Ls_p2, the first inductor Ls1, the parallel inductors Lp_p1 and Lp_p2, and the variable capacitances Cs_p1 and Cs_p2 are provided. In the bandpass characteristics IL4B, the variable capacitances Cs_p1 and Cs_p2 are at 10.0 pF. In the bandpass characteristics IL5B, the variable capacitances Cs_p1 and Cs_p2 are at 2.0 pF. In the bandpass characteristics IL6B, the variable capacitances Cs_p1 and Cs_p2 are at 1.0 pF.

Here, by controlling the capacitances of the variable capacitances Cs_p1 and Cs_p2 between 1.0 pF and 10.0 pF, a cutoff frequency on the high-frequency side of the first pass band on the low-frequency side is successfully adjusted in a band of approximately 160 MHz (710 to 870 MHz). Likewise, the cutoff frequency on the high-frequency side of the second pass band on the high-frequency side is successfully adjusted in a band of approximately 150 MHz (950 to 1100 MHz).

In this manner, in the variable filter circuit 10B as well, the variable capacitances Cs_p1 and Cs_p2 have a function of adjusting the cutoff frequencies on the high-frequency sides of the first and second pass bands. Furthermore, as with the above-described serial inductors Ls_p1 and Ls_p2, the parallel inductors Lp_p1 and Lp_p2 have a function of widening the frequency interval between the resonance point Mfr and the anti-resonance point Mfa and widening the range of variation of the cutoff frequency on the high-frequency side of the pass band.

Although the present embodiment describes an example in which both the parallel inductors Lp_p1 and Lp_p2 and the serial inductors Ls_p1 and Ls_p2 are provided, it is also possible to provide only the parallel inductors Lp_p1 and Lp_p2 without necessarily providing the serial inductors Ls_p1 and Ls_p2.

<<Variations>>

FIG. 11 includes circuit diagrams illustrating variations on the variable filter circuit according to the second embodiment or the third embodiment.

Figure 11A:
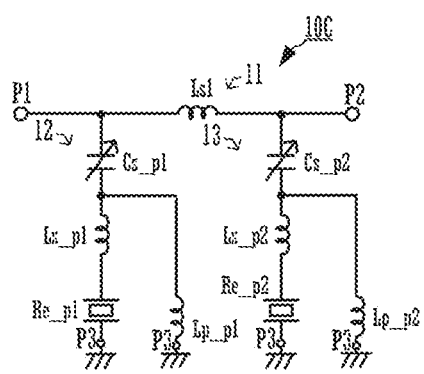
FIGS. 11A-11E include circuit diagrams of variable filter circuits according to variations.

The variable filter circuit 10C illustrated in FIG. 11A has almost the same configuration as in the above-described third embodiment, but one end of the parallel inductor Lp_p1 is connected to a connection point between the variable capacitance Cs_p1 and the serial inductor Ls_p1, and another end is connected to the port P3. In other words, the parallel inductor Lp_p1 is connected in parallel to a serial circuit including the resonator Re_p1 and the serial inductor Ls_p1. Meanwhile, one end of the parallel inductor Lp_p2 is connected to a connection point between the variable capacitance Cs_p2 and the serial inductor Ls_p2, and another end is connected to the port P3. In other words, the parallel inductor Lp_p2 is connected in parallel to a serial circuit including the resonator Re_p2 and the serial inductor Ls_p2.

Figure 11B:
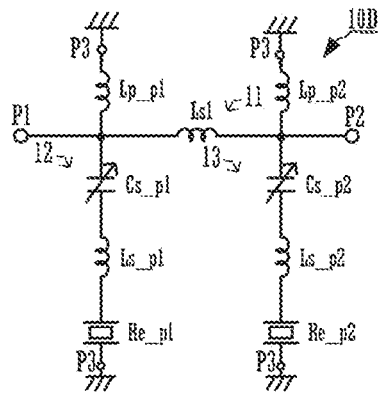

A variable filter circuit 10D illustrated in FIG. 11B has almost the same configuration as in the above-described third embodiment, but the parallel inductors Lp_p1 and Lp_p2 are connected in parallel to serial circuits that include the variable capacitances Cs_p1 and Cs_p2, the serial inductors Ls_p1 and Ls_p2, and the resonators Re_p1 and Re_p2. Specifically, one end of the parallel inductor Lp_p1 is connected to a connection point between the parallel arm 12 and the serial arm 11, and another end is connected to the port P3. Likewise, one end of the parallel inductor Lp_p2 is connected to a connection point between the parallel arm 13 and the serial arm 11, and another end is connected to the port P3.

Comparing the variable filter circuit 10B described earlier with reference to FIG. 8 with the variable filter circuits 10C and 10D, the attenuation level of the attenuation characteristics near the high-frequency side of the pass band tends to be better and the band across which the cutoff frequency on the high-frequency side of the pass band can be adjusted tends to be wider in the variable filter circuit 10B.

Figure 11C:
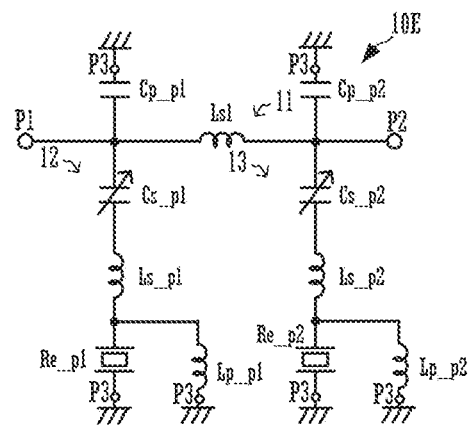

A variable filter circuit 10E illustrated in FIG. 11C has almost the same configuration as in the above-described third embodiment, but the parallel arms 12 and 13 further include parallel capacitors Cp_p1 and Cp_p2. One end of the parallel capacitor Cp_p1 is connected to a connection point between the parallel arm 12 and the serial arm 11, and another end is connected to the port P3. One end of the parallel capacitor Cp_p2 is connected to a connection point between the parallel arm 13 and the serial arm 11, and another end is connected to the port P3.

Comparing the variable filter circuit 10B described above with reference to FIG. 8 with the variable filter circuit 10E, the attenuation characteristics tend to be steeper near the high-frequency side of the pass band in the variable filter circuit 10E.

Figure 11D:
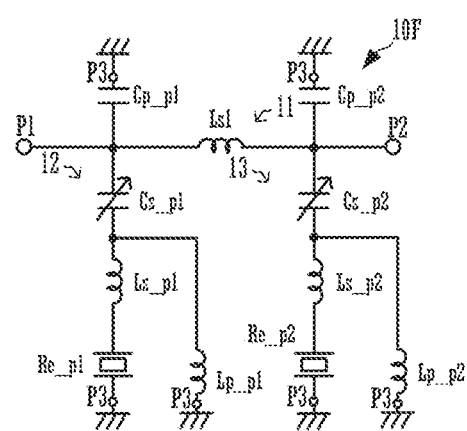

A variable filter circuit 10F illustrated in FIG. 11D has almost the same configuration as the above-described variable filter circuit 10C illustrated in FIG. 11A, but the parallel arms 12 and 13 further include the parallel capacitors Cp_p1 and Cp_p2. One end of the parallel capacitor Cp_p1 is connected to a connection point between the parallel arm 12 and the serial arm 11, and another end is connected to the port P3. Likewise, one end of the parallel capacitor Cp_p2 is connected to a connection point between the parallel arm 13 and the serial arm 11, and another end is connected to the port P3.

Comparing the variable filter circuit 10C described above with reference to FIG. 11A with the variable filter circuit 10F, the attenuation characteristics tend to be steeper near the high-frequency side of the pass band in the variable filter circuit 10F.

Figure 11E:
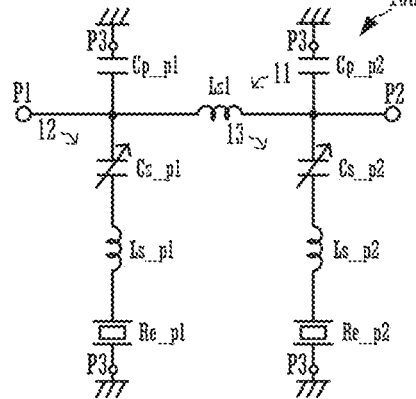

A variable filter circuit 10G illustrated in FIG. 11E has almost the same configuration as in the above-described second embodiment, but the parallel arms 12 and 13 further include the parallel capacitors Cp_p1 and Cp_p2. One end of the parallel capacitor Cp_p1 is connected to a connection point between the parallel arm 12 and the serial arm 11, and another end is connected to the port P3. Likewise, one end of the parallel capacitor Cp_p2 is connected to a connection point between the parallel arm 13 and the serial arm 11, and another end is connected to the port P3.

Comparing the variable filter circuit 10A described above with reference to FIG. 4 with the variable filter circuit 10G, the attenuation characteristics tend to be steeper near the high-frequency side of the pass band in the variable filter circuit 10G.

As described in the foregoing embodiments and variations, providing the first inductor increases the steepness of the attenuation characteristics near the high-frequency side of the pass band, as compared to a case where the first inductor is not provided.

Fourth Embodiment

Figure 12A:
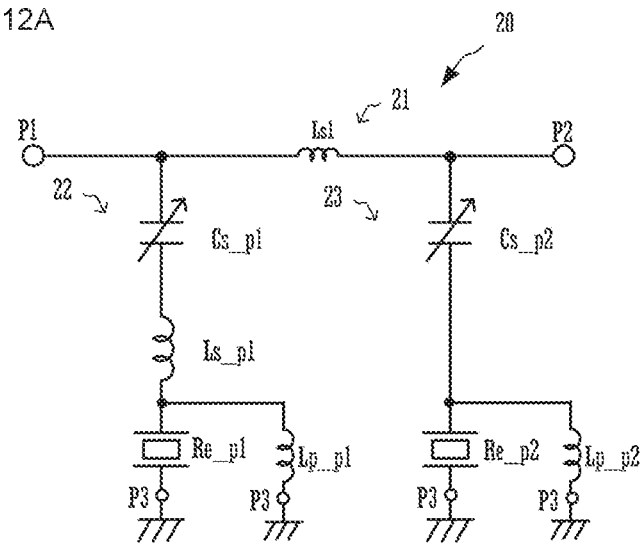
FIGS. 12A-12C include diagrams illustrating a variable filter circuit according to a fourth embodiment.

FIG. 12A is a circuit diagram illustrating a variable filter circuit 20 according to a fourth embodiment.

The variable filter circuit 20 includes a serial arm 21 and parallel arms 22 and 23. The parallel arm 22 includes the variable capacitance Cs_p1 and the resonator Re_p1. The parallel arm 23 includes the variable capacitance Cs_p2 and the resonator Re_p2. The resonator Re_p1 has a resonance point and an anti-resonance point further on the high-frequency side than the resonator Re_p2, and the resonator Re_p2 has a resonance point and an anti-resonance point further on the low-frequency side than the resonator Re_p1. In other words, of the parallel arms 22 and 23, the parallel arm 22 corresponds to a communication band further on the high-frequency side, and the parallel arm 23 corresponds to a communication band further on the low-frequency side. The element values of the variable capacitances Cs_p1 and Cs_p2 are controlled in order to appropriately adjust a cutoff frequency on the low-frequency side of the pass band for communication bands to which the parallel arms 22 and 23 in which the respective capacitances are provided correspond.

The parallel arm 22 further includes the serial inductor Ls_p1 and the parallel inductor Lp_p1 in order to widen the range of variation of the cutoff frequency that can be adjusted by controlling the variable capacitance Cs_p1. The parallel arm 23 further includes the parallel inductor Lp_p2 in order to widen the range of variation of the cutoff frequency that can be adjusted by controlling the variable capacitance Cs_p2. In this manner, in the variable filter circuit 20 according to the present embodiment, an asymmetrical circuit configuration, in which the serial inductor Ls_p1 is provided in the one parallel arm 22 but a serial inductor is omitted from the parallel arm 23, is employed. Omitting a serial inductor from the parallel arm 23 in this manner makes it possible to reduce the circuit size of the variable filter circuit 20.

Figure 12B:
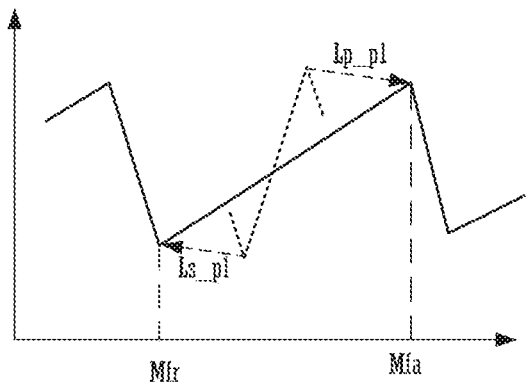
Figure 12C:
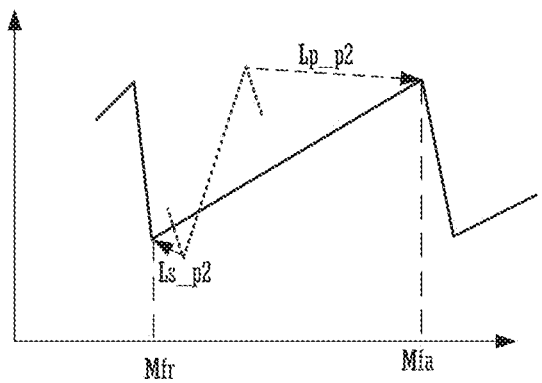

FIGS. 12B and 12C are conceptual diagrams schematically illustrating effects of the respective inductors on the impedance characteristics of a resonator. Impedance waveforms indicated by the dotted lines in the drawings are waveforms corresponding to the resonators only in the parallel arms 22 and 23, respectively, whereas impedance waveforms indicated by the solid lines are waveforms corresponding to the inductors Ls_p1, Lp_p1, and Lp_p2 being added to the resonators.

For example, in the parallel arm 22 corresponding to the high-frequency side, a change in the waveform, relative to the impedance waveform of the resonator Re_p1, occurring near the anti-resonance point Mfa due to the influence of the parallel inductor Lp_p1 is substantially the same as a change in the waveform occurring near the resonance point Mfr due to the influence of the serial inductor Ls_p1, as illustrated in FIG. 12B. To rephrase, in the parallel arm 22 corresponding to the high-frequency side, an effect of expanding the range of variation of the cutoff frequency achieved by the serial inductor Ls_p1 acts to substantially the same extent as an effect of expanding the range of variation of the cutoff frequency achieved by the parallel inductor Lp_p1.

On the other hand, in the parallel arm 23 corresponding to the low-frequency side, there is a large change in the waveform, relative to the impedance waveform of the resonator Re_p2, occurring near the anti-resonance point Mfa due to the influence of the parallel inductor Lp_p2, and there is a small change in the waveform occurring near the resonance point Mfr due to the influence of the serial inductor (see Ls_p2 in FIG. 8), as illustrated in FIG. 12C. Accordingly, it is easy to maintain the steepness of the impedance change near the resonance point Mfr on the low-frequency side. To rephrase, in the parallel arm 23 corresponding to the low-frequency side, an effect of expanding the range of variation of the cutoff frequency achieved by the parallel inductor Lp_p2 acts to a greater extent, and an effect of expanding the range of variation of the cutoff frequency achieved by the serial inductor (Ls_p2) only acts to a lesser extent.

Accordingly, the serial inductor (Ls_p2) in the parallel arm 23 corresponding to a lower frequency side is most desirable as the inductor to be omitted in order to reduce the circuit size of the variable filter circuit 20. Omitting only the serial inductor (Ls_p2) of the parallel arm 23 makes it possible to suppress the circuit size of the variable filter circuit 20 without necessarily causing significant degradation in the filter characteristics of the variable filter circuit 20.

Note, however, that omitting the serial inductor (Ls_p2) of the parallel arm 23 tends to narrow the range of variation of the cutoff frequency that can be adjusted by controlling the variable capacitance Cs_p2 in the parallel arm 23. Accordingly, an element having a lower inductance than the parallel inductor Lp_p1 provided in the other parallel arm 22 can be set as the parallel inductor Lp_p2 provided in the parallel arm 23. Setting the parallel inductor Lp_p2 in this manner makes it possible to prevent significant narrowing of the range of variation of the cutoff frequency that can be adjusted by controlling the variable capacitance Cs_p2 in the parallel arm 23.

Figure 13:
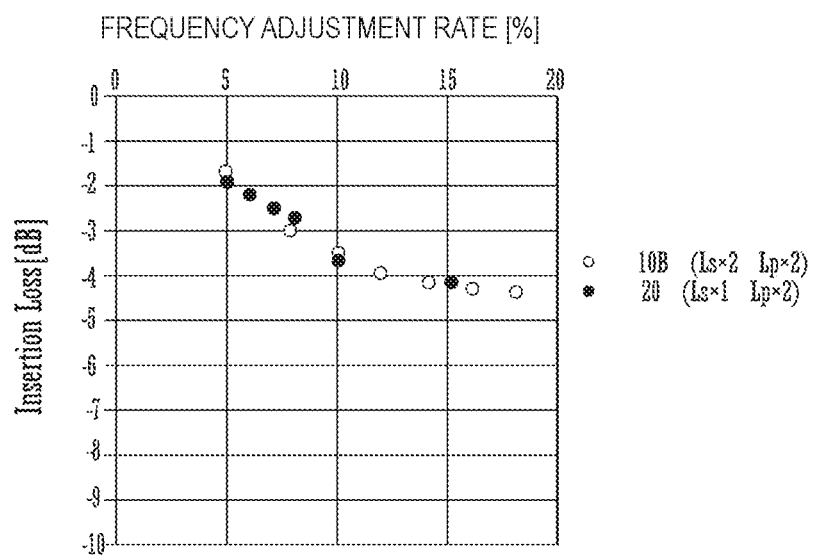
FIG. 13 is a diagram illustrating a result of a characteristic test of the variable filter circuit according to the fourth embodiment.

Results of experiments carried out for filter characteristics, using a plurality of pieces of sample data prepared for each of a plurality of different circuit configurations having pass bands in predetermined communication bands, will be described next. FIG. 13 is a diagram comparing attenuations at points of minimum insertion loss in a pass band in various variable filter circuit configurations set to correspond to the same communication band. Each plot in FIG. 13 represents an average value of a plurality of pieces of sample data prepared for each of different circuit configurations. Additionally, a plurality of samples in which an adjustment amount of the variable capacitance (a frequency adjustment rate, corresponding to a percentage by which the center frequency of the pass band changes in response to controlling the variable capacitance) differs by constant amounts were prepared for each circuit configuration. Accordingly, in an actual variable filter circuit structure, desired filter characteristics are obtained by making fine adjustments to each variable capacitance. Additionally, a comparison of IL characteristics between the variable filter circuit 10B according to the third embodiment (see FIG. 8) and the variable filter circuit 20 according to the fourth embodiment (see FIG. 12A) is indicated here.

From these experiment results, it can be seen that up to a frequency adjustment rate of approximately 15% in the variable filter circuit, even if the configuration of the variable filter circuit 20, which omits the serial inductor (Ls_p2) of the parallel arm 23 corresponding to the low-frequency side, is employed, there is no significant degradation compared to the variable filter circuit 10B, in which all of the inductors are provided.

In this manner, it can be confirmed, even from experiments using sample data, that omitting only the serial inductor (Ls_p2) of the parallel arm 23 as in the variable filter circuit 20 according to the present embodiment makes it possible to suppress the circuit size of the variable filter circuit 20 without necessarily causing significant degradation in the filter characteristics of the variable filter circuit 20.

Fifth Embodiment

Figure 14:
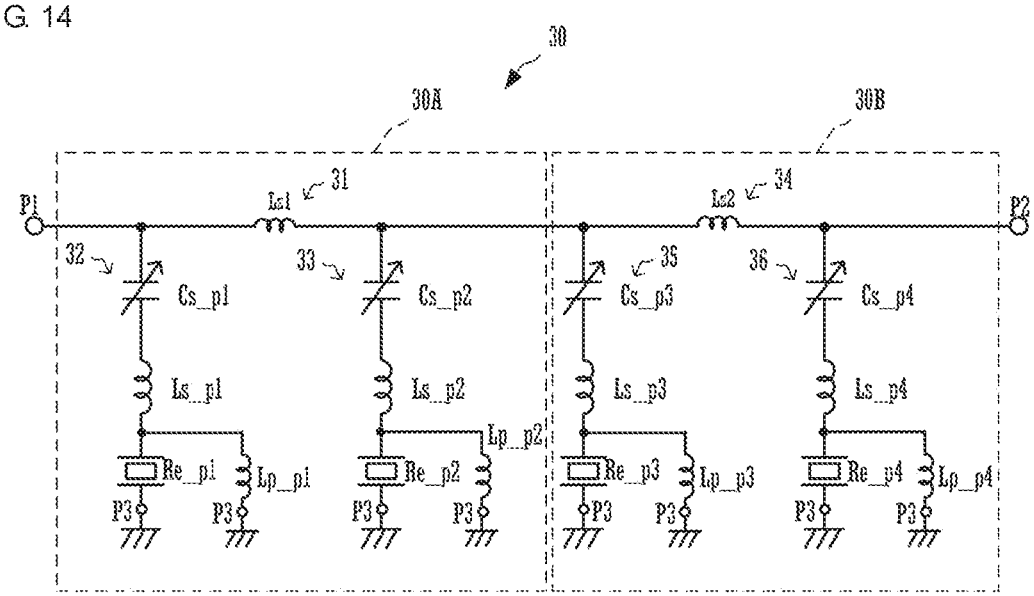
FIG. 14 is a circuit diagram of a variable filter circuit according to a fifth embodiment.

FIG. 14 is a circuit diagram illustrating a variable filter circuit 30 according to a fifth embodiment.

The variable filter circuit 30 includes a first circuit portion 30A and a second circuit portion 30B. The first circuit portion 30A and the second circuit portion 30B both have the same circuit configuration as the variable filter circuit 10B described earlier in the third embodiment. The first circuit portion 30A includes a serial arm 31 and parallel arms 32 and 33. The second circuit portion 30B includes a serial arm 34 and parallel arms 35 and 36.

Here, the parallel arm 32 includes the resonator Re_p1, the variable capacitance Cs_p1, the serial inductor Ls_p1, and the parallel inductor Lp_p1. The parallel arm 33 includes the resonator Re_p2, the variable capacitance Cs_p2, the serial inductor Ls_p2, and the parallel inductor Lp_p2. The parallel arm 35 includes a resonator Re_p3, the variable capacitance Cs_p3, a serial inductor Ls_p3, and a parallel inductor Lp_p3. The parallel arm 36 includes a resonator Re_p4, a variable capacitance Cs_p4, a serial inductor Ls_p4, and a parallel inductor Lp_p4.

The resonators Re_p1 and Re_p2 and the resonators Re_p3 and Re_p4 respectively correspond to communication bands having different pass bands and stop bands. Additionally, the variable capacitances Cs_p1 and Cs_p2 and the variable capacitances Cs_p3 and Cs_p4 are controlled to appropriate element values in order to appropriately set filter characteristics in the communication bands to which the resonators Re_p1 and Re_p2 or the resonators Re_p3 and Re_p4 that are connected correspond. The serial inductors Ls_p1 and Ls_p2 and the serial inductors Ls_p3 and Ls_p4, and the parallel inductors Lp_p1 and Lp_p2 and the parallel inductors Lp_p3 and Lp_p4, are each set to appropriate element values in order to appropriately set filter characteristics in the communication bands to which the resonators Re_p1 and Re_p2 or the resonators Re_p3 and Re_p4 that are connected correspond.

In this manner, the variable filter circuit can be implemented as a multi-stage circuit by connecting the circuit portions 30A and 30B corresponding to a plurality of the filter circuits 10B. Having the circuit portions 30A and 30B handle different frequency bands makes it possible to improve the filter characteristics of the circuit portions 30A and 30B, respectively. As a result, the variable filter circuit can be caused to handle more communication bands.

Although the first circuit portion 30A and the second circuit portion 30B are described here as having the same circuit configuration as the variable filter circuit 10B described in the third embodiment, the circuit configurations according to other variations, the circuit configuration according to other embodiments, and so on may be combined as appropriate. Additionally, a greater number of circuit portions may be connected and used as well.

Sixth Embodiment

Figure 15:
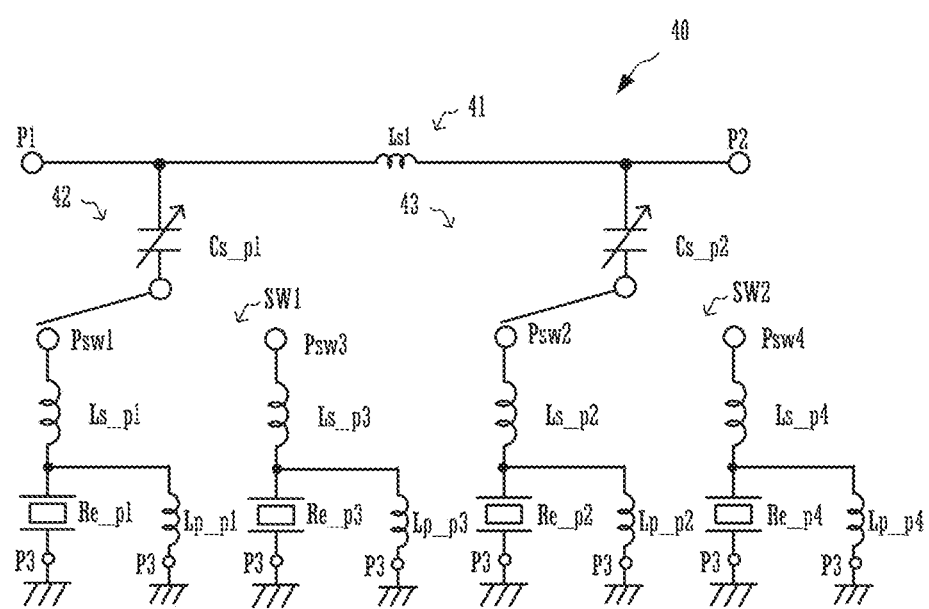
FIG. 15 is a circuit diagram of a variable filter circuit according to a sixth embodiment.

FIG. 15 is a circuit diagram illustrating a variable filter circuit 40 according to a sixth embodiment.

The variable filter circuit 40 includes a serial arm 41 and parallel arms 42 and 43. The parallel arm 42 includes the variable capacitance Cs_p1, a selecting portion SW1, the resonators Re_p1 and Re_p3, the serial inductors Ls_p1 and Ls_p3, and the parallel inductors Lp_p1 and Lp_p3. The parallel arm 43 includes the variable capacitance Cs_p2, a selecting portion SW2, the resonators Re_p2 and Re_p4, the serial inductors Ls_p2 and Ls_p4, and the parallel inductors Lp_p2 and Lp_p4.

The selecting portion SW1 is connected to the port P3 (ground connection end) side of the variable capacitance Cs_p1. The selecting portion SW1 includes a connection switching port Psw1 and a connection switching port Psw3, and can switch the connection switching port Psw1 and the connection switching port Psw3 to connect to the variable capacitance Cs_p1. The resonator Re_p1, the serial inductor Ls_p1, and the parallel inductor Lp_p1 are connected to the connection switching port Psw1. The resonator Re_p3, the serial inductor Ls_p3, and the parallel inductor Lp_p3 are connected to the connection switching port Psw3.

The selecting portion SW2 is connected to the port P3 (ground connection end) side of the variable capacitance Cs_p2. The selecting portion SW2 includes a connection switching port Psw2 and a connection switching port Psw4, and can switch the connection switching port Psw2 and the connection switching port Psw4 to connect to the variable capacitance Cs_p2. The resonator Re_p2, the serial inductor Ls_p2, and the parallel inductor Lp_p2 are connected to the connection switching port Psw2. The resonator Re_p4, the serial inductor Ls_p4, and the parallel inductor Lp_p4 are connected to the connection switching port Psw4.

Like the fifth embodiment, in the present embodiment, the resonators Re_p1, Re_p2, Re_p3, and Re_p4 respectively correspond to communication bands having different pass bands and stop bands. Additionally, the variable capacitances Cs_p1 and Cs_p2 are controlled to appropriate element values in order to appropriately set filter characteristics in the communication bands to which the resonators Re_p1, Re_p2, Re_p3, and Re_p4 that are connected correspond. The serial inductors Ls_p1, Ls_p2, Ls_p3, and Ls_p4, and the parallel inductors Lp_p1, Lp_p2, Lp_p3, and Lp_p4, are each set to appropriate element values in order to appropriately set filter characteristics in the communication bands to which the resonators Re_p1, Re_p2, Re_p3, and Re_p4 that are connected correspond.

Figures 16A, 16B:
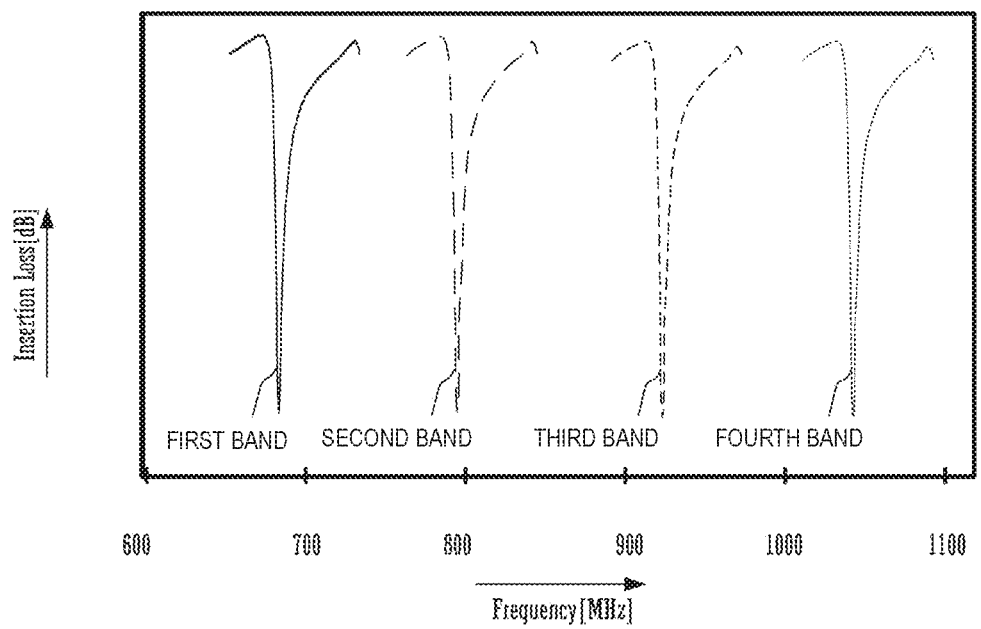
FIGS. 16A and 16B include a characteristic graph schematically illustrating a function of the variable filter circuit according to the sixth embodiment.

Additionally, with the variable filter circuit 40, the filter characteristics are changed and the corresponding communication band is changed by controlling the selecting portion SW1 to connect one of the connection switching ports Psw1 and Psw3 to the variable capacitance Cs_p1 and by controlling the selecting portion SW2 to connect one of the connection switching ports Psw2 and Psw4 to the variable capacitance Cs_p2. FIG. 16 includes a characteristic graph schematically illustrating a correspondence relationship between control states of the selecting portions SW1 and SW2 and the filter characteristics of the variable filter circuit 40. FIG. 16A is a chart illustrating examples of settings for the control states of the resonator selecting portions SW1 and SW2, and FIG. 16B is a characteristic graph indicating changes in a pass band determined according to the settings for the control states of the resonator selecting portions SW1 and SW2.

For example, when causing the filter characteristics of the variable filter circuit 40 to correspond to a first band or a second band, among a plurality of communication bands, that are on the low-frequency side, the selecting portions SW1 and SW2 are controlled so that the connection switching port Psw1 is selected and connected by the selecting portion SW1 and the connection switching port Psw2 is selected and connected by the selecting portion SW2. Furthermore, by controlling the variable capacitance, the pass band of the variable filter circuit 40 is adjusted to the first band or the second band.

Additionally, when causing the filter characteristics of the variable filter circuit 40 to correspond to a third band or a fourth band, among a plurality of communication bands, that are on the high-frequency side, the selecting portions SW1 and SW2 are controlled so that the connection switching port Psw3 is selected and connected by the selecting portion SW1 and the connection switching port Psw4 is selected and connected by the selecting portion SW2. Furthermore, by controlling the variable capacitance, the pass band of the variable filter circuit 40 is adjusted to the third band or the fourth band.

According to this variable filter circuit 40, the selecting portion SW1 is controlled to connect one of the connection switching ports Psw1 and Psw3 to the variable capacitance Cs_p1 and the selecting portion SW2 is controlled to connect one of the connection switching ports Psw2 and Psw4 to the variable capacitance Cs_p2. Accordingly, a large frequency adjustment can be made by the switching performed by the resonator selecting portions SW1 and SW2, and a fine frequency adjustment can be made by adjusting the variable capacitance. This makes it possible to change the filter characteristics of the variable filter circuit 40 so as to correspond to many communication bands.

Furthermore, according to this variable filter circuit 40, many communication bands can be handled without necessarily increasing the total number of serial arms, increasing the total number of variable capacitances, and so on. For example, in the fifth embodiment described earlier, it is necessary to provide substantially the same number of parallel arms as the number of the communication bands to be handled, and thus the total number of elements tends to rise due to the elements being provided in each of the parallel arms. However, in the present embodiment, the selecting portions SW1 and SW2 are provided and the variable capacitances Cs_p1 and Cs_p2 are shared among the plurality of communication bands, and thus it is no longer necessary to provide the elements of the parallel arms for each of the communication bands. The total number of the variable capacitances Cs_p1 and Cs_p2 can therefore be suppressed, which makes it possible to prevent the circuit size from increasing, the control of the variable capacitances Cs_p1 and Cs_p2 becoming complicated, and so on.

Although this embodiment describes an example in which the serial inductors, parallel inductors, and the like provided in the respective parallel arms are connected to the connection switching port sides of the selecting portions, the serial inductors, parallel inductors, and the like may be connected to the variable capacitance sides of the selecting portions. In this case, the total number of serial inductors, parallel inductors, and so on provided in each parallel arm can be suppressed, which makes it possible to further suppress the circuit size. Additionally, although an example in which there are a total of two connection switching ports, resonators, and so on provided in each selecting portion is described here, a total of more than two connection switching ports, connected resonators, and so on may be provided in each selecting portion. In this case, the variable filter circuit can handle a greater number of communication bands.

Seventh Embodiment

Figure 17:
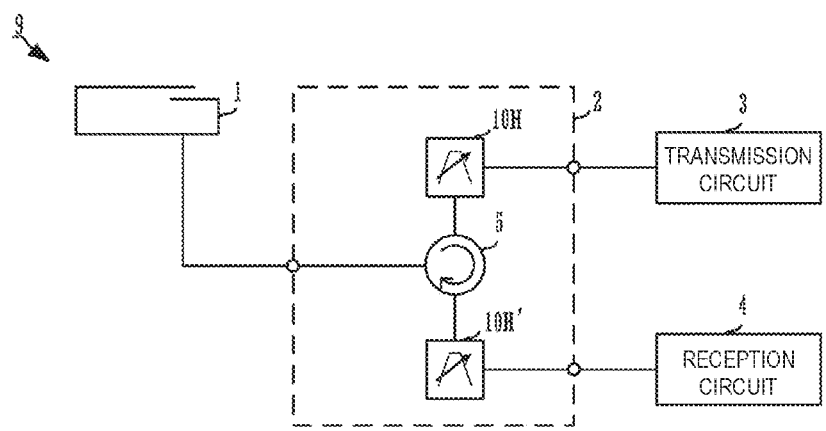
FIG. 17 is a circuit diagram illustrating a wireless communication apparatus according to a seventh embodiment.

FIG. 17 is a block diagram illustrating a wireless communication apparatus 9 according to a seventh embodiment.

The wireless communication apparatus 9 includes an antenna 1, a front end circuit 2, a transmission circuit 3, and a reception circuit 4. The transmission circuit 3 is configured to be capable of handling a plurality of communication bands in a communication system such as LTE, and outputs a transmission signal having switched to a corresponding communication band. The reception circuit 4 is configured to be capable of handling a plurality of communication bands in a communication system such as LTE, and accepts the input of a reception signal having switched to a corresponding communication band. The front end circuit 2 is connected between the antenna 1, and the transmission circuit 3 and reception circuit 4, and includes a variable filter circuit 10H connected to the transmission circuit 3, a variable filter circuit 10H' connected to the reception circuit 4, and a circulator 5. The circulator 5 is given directionality with respect to a propagation direction of signals, so that the transmission signal propagates from the transmission circuit 3 to the antenna 1 and the reception signal propagates from the antenna 1 to the reception circuit 4. The circuit configurations of the variable filter circuits 10H and 10H' will be described later.

In the wireless communication apparatus 9 configured in this manner, the variable filter circuit 10H on the transmission side allows a transmission signal to pass and cuts a reception signal by controlling a variable capacitance so as to match a pass band to a transmission band in a communication band to which the transmission circuit 3 corresponds. Likewise, the variable filter circuit 10H' on the reception side allows a reception signal to pass and cuts a transmission signal by controlling a variable capacitance so as to match a pass band to a reception band in a communication band to which the reception circuit 4 corresponds. By setting the variable filter circuit 10H on the transmission side and the variable filter circuit 10H' on the reception side so that signals of frequencies on mutually-opposite sides are attenuated, transmission signals are suppressed from affecting the reception circuit, making it possible to ensure a good reception sensitivity.

Meanwhile, in the case where the first pass band on the low-frequency side is used in the variable filter circuits 10H and 10H', it is necessary for the variable filter circuits 10H and 10H' to meet the following first requirement, the following second requirement, and so on. The first requirement is that in at least one parallel arm, the anti-resonance point (Mfa) in the case where there is no variable capacitance is at a frequency that is higher than an upper limit frequency on the high-frequency side of the stop band of the communication band, among the plurality of communication bands, that is furthest on the high-frequency side. Meanwhile, the second requirement is that in at least one parallel arm, the resonance point (Mfr) in the case where there is no variable capacitance is at a frequency that is lower than a lower limit frequency on the low-frequency side of the stop band of the communication band, among the plurality of communication bands, that is furthest on the low-frequency side. If the variable filter circuits 10H and 10H' meet the first requirement and the second requirement, the plurality of communication bands are all contained within a band between the resonance point (Mfr) and the anti-resonance point (Mfa), and thus the cutoff frequencies on the high-frequency sides of the first pass bands of the variable filter circuits 10H and 10H' can be adjusted to the high-frequency sides of the pass bands of the respective plurality of communication bands by controlling the variable capacitances of the variable filter circuits 10H and 10H'.

Additionally, in the case where the second pass band on the high-frequency side is used, a necessary requirement for the variable filter circuits 10H and 10H' is that in at least one parallel arm, the sub-resonance point (Sfr) in the case where there is no variable capacitance is at a frequency that is lower than a lower limit frequency on the low-frequency side of the stop band of the communication band, among the plurality of communication bands, that is furthest on the low-frequency side. If the variable filter circuits 10H and 10H' meet this requirement, the plurality of communication bands are all contained within a band that is higher than the sub-resonance point (Sfr), and thus the cutoff frequencies on the high-frequency sides of the second pass bands on the high-frequency sides in the variable filter circuits 10H and 10H' can be adjusted to the high-frequency sides of the pass bands of the respective plurality of communication bands by controlling the variable capacitances of the variable filter circuits 10H and 10H'.

Figure 18:
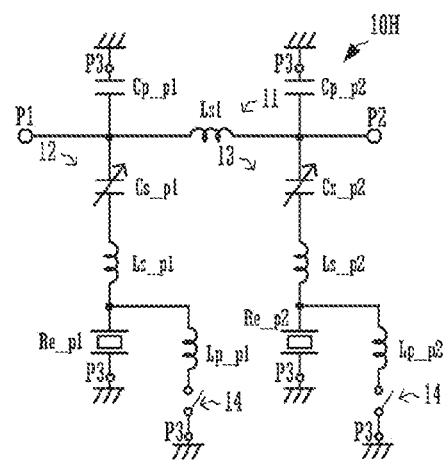
FIG. 18 is a circuit diagram of a variable filter circuit according to the seventh embodiment.

FIG. 18 is a circuit diagram illustrating the variable filter circuit 10H.

The variable filter circuit 10H has almost the same configuration as in the above-described third embodiment (particularly the variable filter circuit 10E illustrated in FIG. 11C), but the parallel arm 12 and the parallel arm 13 each further includes a switch 14. The switches 14 are provided to turn the connections of the parallel inductors Lp_p1 and Lp_p2 to the variable filter circuit 10H on or off. In this manner, using the on/off functions of the switches 14 makes it possible to change the attenuation characteristics of the variable filter circuit 10H.

An example of specific settings in the case where the attenuation characteristics of the variable filter circuit 10H are changed by using the on/off functions of the switches 14 will be described next with reference to FIG. 19.

For example, a communication band Band 17 defined by a communication system such as LTE has a relationship in which the transmission band (704 MHz-716 MHz) is lower than the reception band (734 MHz-746 MHz). Meanwhile, in a communication band Band 14, for example, the transmission band (788 MHz-798 MHz) is at a higher frequency than the reception band (758 MHz-768 MHz). In this manner, there are cases where a plurality of communication bands defined in various communication systems have inverse frequency relationships between the transmission band and the reception band from communication band to communication band. Generally speaking, with a communication band such as the communication band Band 17, in which the transmission band is at a lower frequency than the reception band, a transmission-side filter circuit requires the attenuation characteristics to be steep near the high-frequency side of the pass band, and a reception-side filter circuit requires the attenuation characteristics to be steep near the low-frequency side of the pass band. On the other hand, with a communication band such as the communication band Band 14, in which the transmission band is at a higher frequency than the reception band, the transmission-side filter circuit requires the attenuation characteristics to be steep near the low-frequency side of the pass band, and the reception-side filter circuit requires the attenuation characteristics to be steep near the high-frequency side of the pass band.

Accordingly, the variable filter circuit 10H according to the present embodiment makes it possible to switch between a state in which the attenuation characteristics are steep near the high-frequency side of the first pass band on the low-frequency side and a state in which the attenuation characteristics are steep near the low-frequency side of the second pass band on the high-frequency side. Note that it is possible to switch between a state in which the attenuation characteristics are steep near the high-frequency side of the first pass band on the low-frequency side and a state in which the attenuation characteristics are steep near the low-frequency side of the second pass band on the high-frequency side by adjusting the values of parameters for each element through the turning the switches 14 on and off.

For example, in the variable filter circuit 10H, when the inductance of the first inductor Ls1 is increased, there is a stronger tendency for the attenuation characteristics to be steep near the high-frequency side of the first pass band on the low-frequency side. Conversely, in the variable filter circuit 10H, when the inductance of the first inductor Ls1 is reduced, there is a stronger tendency for the attenuation characteristics to be steep near the low-frequency side of the second pass band on the high-frequency side.

Likewise, in the variable filter circuit 10H, when the inductances of the parallel inductors Lp_p1 and Lp_p2 are reduced, there is a stronger tendency for the attenuation characteristics to be steep near the high-frequency side of the first pass band on the low-frequency side. Conversely, in the variable filter circuit 10H, when the inductances of the parallel inductors Lp_p1 and Lp_p2 are increased, there is a stronger tendency for the attenuation characteristics to be steep near the low-frequency side of the second pass band on the high-frequency side.

Additionally, in the variable filter circuit 10H, when the impedances of the resonators Re_p1 and Re_p2 are reduced, there is a stronger tendency for the attenuation characteristics to be steep near the high-frequency side of the first pass band on the low-frequency side. Conversely, in the variable filter circuit 10H, when the impedances of the parallel inductors Lp_p1 and Lp_p2 are increased, there is a stronger tendency for the attenuation characteristics to be steep near the low-frequency side of the second pass band on the high-frequency side.

Figure 19A:
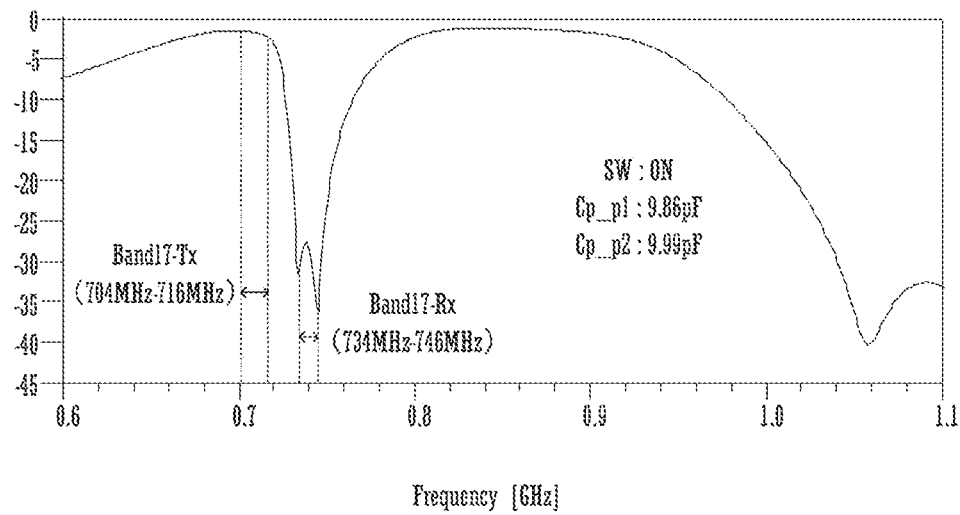
FIGS. 19A and 19B illustrate characteristic graphs indicating a function of a switch that constitutes the variable filter circuit according to the seventh embodiment.
Figure 19B:
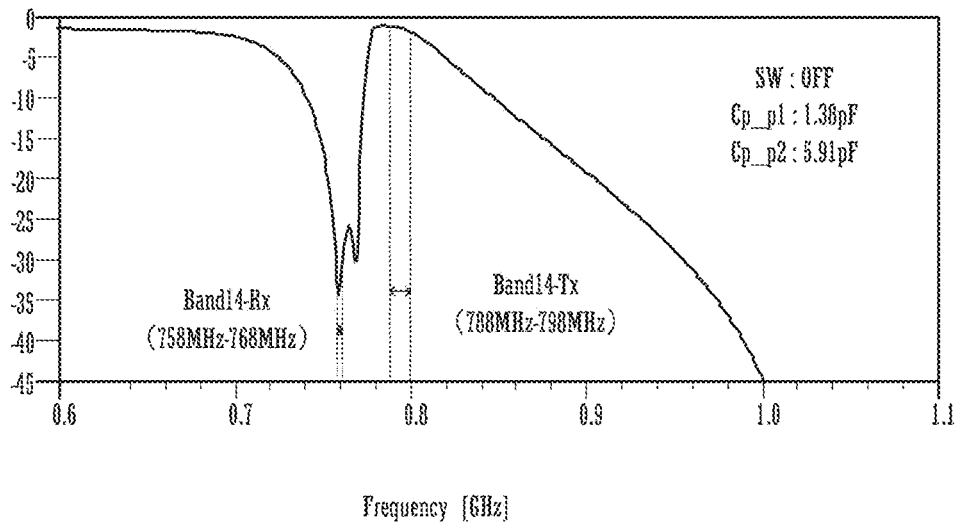

FIG. 19A is a bandpass characteristic graph for the variable filter circuit 10H in a state where the switches 14 are on. FIG. 19B is a bandpass characteristic graph for the variable filter circuit 10H in a state where the switches 14 are off. A case where the variable filter circuit 10H is used as the transmission-side filter circuit is illustrated here.

For a communication band such as Band 17, in which the transmission band is lower than the reception band, it is necessary for the variable filter circuit 10H to allow a transmission band on the low-frequency side (704 MHz-716 MHz) to pass while cutting a reception band on the high-frequency side (734 MHz-746 MHz). Accordingly, when handling such a communication band, the variable filter circuit 10H is set to a state where the attenuation characteristics are steep near the high-frequency side of the first pass band on the low-frequency side, as illustrated in FIG. 19A. Specifically, the variable filter circuit 10H is set so that, in bandpass characteristics when the switches 14 are on, the first pass band on the low-frequency side overlaps with a band from approximately 704 MHz to approximately 716

MHz, a stop band near the high-frequency side of the first pass band overlaps with a band from approximately 734 MHz to approximately 746 MHz, the cutoff frequency on the high-frequency side of the first pass band is between approximately 716 MHz and approximately 734 MHz, and the attenuation characteristics near the high-frequency side of the first pass band are steeper than the attenuation characteristics near the low-frequency side of the second pass band.

On the other hand, for a communication band such as Band 14, in which the transmission band is higher than the reception band, it is necessary for the variable filter circuit 10H to allow a transmission band on the high-frequency side (788 MHz-798 MHz) to pass while cutting a reception band on the low-frequency side (758 MHz-768 MHz). Accordingly, when handling such a communication band, the variable filter circuit 10H is set to a state where the attenuation characteristics are steep near the low-frequency side of the second pass band on the high-frequency side, as illustrated in FIG. 19B. Specifically, the variable filter circuit 10H is set so that, in bandpass characteristics when the switches 14 are off, the second pass band on the high-frequency side overlaps with a band from approximately 788 MHz to approximately 798 MHz, a stop band near the low-frequency side of the second pass band overlaps with a band from approximately 758 MHz to approximately 768 MHz, the cutoff frequency on the low-frequency side of the second pass band is between approximately 768 MHz and approximately 788 MHz, and the attenuation characteristics near the low-frequency side of the second pass band are steeper than the attenuation characteristics near the high-frequency side of the first pass band in the variable filter circuit 10H.

In this manner, by using the on/off functions of the switches 14 to switch between making the attenuation characteristics steep near the high-frequency side of the pass band and making the attenuation characteristics steep near the low-frequency side of the pass band, the variable filter circuit 10H can allow to pass or stop signals appropriately even in the case where the communication band to be handled is a band in which a stop band that is lower than a pass band is defined or a stop band that is higher than a pass band is defined.

Although the present embodiment describes providing the switches 14 so that the parallel inductors Lp_p1 and Lp_p2 connected in parallel to the resonators Re_p1 and Re_p2 are turned on or off, the switches 14 may be connected in different positions. For example, the parallel inductors Lp_p1 and Lp_p2 and the switches 14 may be connected at the locations where the parallel inductors Lp_p1 and Lp_p2 are connected in FIGS. 11A, 11B, and so on. Additionally, the parallel capacitors Cp_p1 and Cp_p2 and the switches 14 may be connected at the locations where the parallel capacitors Cp_p1 and Cp_p2 are connected.

The present disclosure can be carried out as described thus far. Note that the present disclosure can be carried out through any other configuration aside from those described in the foregoing embodiments as long as that configuration corresponds to the configurations described in the claims. For example, a circuit, element, or the like in which a variable inductance rather than a variable capacitance is used as the variable reactance can also be used.

REFERENCE SIGNS LIST

9 WIRELESS COMMUNICATION APPARATUS
1 ANTENNA
2 FRONT END CIRCUIT
3 TRANSMISSION CIRCUIT
4 RECEPTION CIRCUIT
10 VARIABLE FILTER CIRCUIT
11 SERIAL ARM
12, 13 PARALLEL ARM
14 SWITCH

The invention claimed is:

1. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a first inductor connected in series between the first input/output end and the second input/output end,
at least one of the first and second parallel arms includes a variable reactance connected in series to the first or second resonator,
at least one of the first parallel arm and the second parallel arm further includes a parallel inductor and/or a parallel capacitor connected in parallel to the respective first or second resonator.

2. The variable filter circuit according to claim 1, wherein at least one of the first parallel arm and the second parallel arm further includes a series inductor connected in series to the first or second resonator.

3. The variable filter circuit according to claim 1, wherein at least one of the first parallel arm and the second parallel arm further includes a switch that switches a connection state of the parallel inductor on or off.

4. A wireless communication apparatus comprising:
a front end circuit including the variable filter circuit according to claim 1;
an antenna; and
a communication circuit connected to the antenna with the front end circuit provided therebetween.

5. The wireless communication apparatus according to claim 4,
wherein the communication circuit handles a plurality of communication bands;
when at least one of the parallel arms does not include the variable reactance, an anti-resonance point is higher than an upper limit frequency on a high-frequency side of a stop band of the communication band, among the plurality of communication bands, that is furthest on the high-frequency side; and
when at least one of the parallel arms does not include the variable reactance, a resonance point is lower than a lower limit frequency on a low-frequency side of a stop band of the communication band, among the plurality of communication bands, that is furthest on the low-frequency side.

6. The wireless communication apparatus according to claim 4,
wherein the variable filter circuit includes a series inductor connected in series to each of the first and second resonators;
the communication circuit handles a plurality of communication bands; and
when at least one of the parallel arms does not include the variable reactance, a sub-resonance point is lower than a lower limit frequency on a low-frequency side of a stop band of the communication band, among the plurality of communication bands, that is furthest on the low-frequency side.

7. The variable filter circuit according to claim 1, wherein each of the first and second parallel arms includes a variable reactance connected in series to the first and second resonators, respectively.

8. The variable filter circuit according to claim 1, wherein the variable reactance is a variable capacitance.

9. The variable filter circuit according to claim 1, wherein the variable reactance is a variable inductance.

10. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a first inductor connected in series between the first input/output end and the second input/output end,
at least one of the first and second parallel arms includes a variable reactance connected in series to the first or second resonator, and
at least one of the first parallel arm and the second parallel arm includes a parallel inductor connected in parallel to the first or second resonator and a series inductor connected in series to a circuit in which the first or second resonator and the parallel inductor are connected in parallel.

11. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a first inductor connected in series between the first input/output end and the second input/output end,
at least one of the first and second parallel arms includes a variable reactance connected in series to the first or second resonator, and
at least one of the first parallel arm and the second parallel arm includes a series inductor connected in series to the first or second resonator and a parallel inductor connected in parallel to a circuit in which the first or second resonator and the series inductor are connected in series.

12. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a first inductor connected in series between the first input/output end and the second input/output end,
at least one of the first and second parallel arms includes a variable reactance connected in series to the first or second resonator,
the first parallel arm includes a first parallel inductor connected in parallel to the first resonator and the second parallel arm further includes a second parallel inductor connected in parallel to the second resonator,
the first parallel arm includes a series inductor connected in series to the first resonator, and
the second parallel arm does not include a series inductor connected in series to the second resonator.

13. The variable filter circuit according to claim 12, wherein a resonance point and an anti-resonance point of the first resonator included in the first parallel arm are further on a high-frequency side than a resonance point and an anti-resonance point of the second resonator included in the second parallel arm.

14. The variable filter circuit according to claim 12, wherein an inductance of the second parallel inductor included in the second parallel arm is lower than an inductance of the first parallel inductor included in the first parallel arm.

15. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a first inductor connected in series between the first input/output end and the second input/output end,
at least one of the first and second parallel arms includes a variable reactance connected in series to the first or second resonator, and
at least one of the first parallel arm and the second parallel arm includes a plurality of resonators and a switch that selects one of the plurality of resonators and connects the selected resonator in series to the variable reactance.

16. The variable filter circuit according to claim 15, wherein at least one of the first parallel arm and the second parallel arm includes a plurality of series inductors respectively connected in series to the plurality of resonators; and
the switch selects one of the plurality of serial inductors and one of the plurality of resonators as a set and connects the selected inductor and the selected resonator in series to the variable reactance.

17. The variable filter circuit according to claim 15, wherein at least one of the first parallel arm and the second parallel arm includes a plurality of parallel inductors respectively connected in parallel to the plurality of resonators; and
the switch selects one of the plurality of parallel inductors and one of the plurality of resonators as a set and connects the selected inductor and the selected resonator in series to the variable reactance.

* * * * *